United States Patent
Kim et al.

(10) Patent No.: US 10,310,036 B2
(45) Date of Patent: Jun. 4, 2019

(54) MAGNETIC RESONANCE IMAGING APPARATUS AND METHOD FOR DETECTING ERROR OF MAGNETIC RESONANCE IMAGING APPARATUS

(71) Applicant: SAMSUNG ELECTRONICS CO., LTD., Suwon-si (KR)

(72) Inventors: Jin-sub Kim, Seoul (KR); Raghavendra Putti, Suwon-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 173 days.

(21) Appl. No.: 15/408,555

(22) Filed: Jan. 18, 2017

(65) Prior Publication Data
US 2017/0205481 A1    Jul. 20, 2017

(30) Foreign Application Priority Data

Jan. 18, 2016    (KR) ........................ 10-2016-0005991

(51) Int. Cl.
*G01V 3/00* (2006.01)
*G01R 33/36* (2006.01)
*G01R 33/58* (2006.01)

(52) U.S. Cl.
CPC ..... *G01R 33/3671* (2013.01); *G01R 33/3628* (2013.01); *G01R 33/3657* (2013.01); *G01R 33/583* (2013.01)

(58) Field of Classification Search
CPC ................ G01R 33/3415; G01R 33/36; G01R 33/3628; G01R 33/3657; G01R 33/34007;
(Continued)

(56) References Cited

U.S. PATENT DOCUMENTS 5,666,055 A * 9/1997 Jones ................. G01R 33/3415
    324/318
6,362,622 B1    3/2002 Stauber et al.
(Continued)

FOREIGN PATENT DOCUMENTS

JP    2-27905 A    1/1990
JP    9-276245 A    10/1997
(Continued)

OTHER PUBLICATIONS

Hefner, et al., "Characterization of SiC PiN Diode Forward Bias Degradation", IAS 2004, pp. 1252-1260.
(Continued)

*Primary Examiner* — Rodney E Fuller
(74) *Attorney, Agent, or Firm* — Sughrue Mion, PLLC

(57) ABSTRACT

A magnetic resonance imaging (MRI) apparatus and a method of detecting an error of the MRI apparatus are provided. The MRI apparatus includes a radio frequency (RF) coil configured to transmit and receive an RF signal, a bias circuit configured to tune and detune the RF coil, and a monitoring circuit configured to monitor a parameter among a bias voltage and a bias current of the bias circuit, based on a monitoring pattern. The MRI apparatus further includes a controller configured to determine whether the bias circuit is in an abnormal state, based on a determination criteria and the monitored parameter, and either one or both of the monitoring pattern and the determination criteria vary based on a status of the bias circuit.

20 Claims, 12 Drawing Sheets

(58) Field of Classification Search
CPC ............ G01R 33/3621; G01R 33/3664; G01R 33/543; G01R 33/58; G01R 33/341; H02H 3/202; H02H 3/20
USPC ........................................................ 324/309
See application file for complete search history.

(56) References Cited

U.S. PATENT DOCUMENTS

| | | |
|---|---|---|
| 6,414,485 B1 | 7/2002 | Kato et al. |
| 6,897,658 B2 | 5/2005 | Belt et al. |
| 8,515,696 B2 | 8/2013 | Huff et al. |
| 2005/0122108 A1 | 6/2005 | Yasuhara et al. |
| 2010/0039113 A1 | 2/2010 | Vartiovaara |
| 2010/0308840 A1 | 12/2010 | Nerreter |
| 2012/0191383 A1 | 7/2012 | Huff et al. |
| 2016/0097829 A1 | 4/2016 | Reykowski et al. |

FOREIGN PATENT DOCUMENTS

| | | |
|---|---|---|
| JP | 9-322887 A | 12/1997 |
| JP | 2001-346775 A | 12/2001 |
| JP | 2005-261924 A | 9/2005 |
| JP | 2005-336040 A | 12/2005 |
| JP | 2013-17493 A | 1/2013 |
| JP | 2015-150053 A | 8/2015 |
| WO | 2014/174396 A1 | 10/2014 |

OTHER PUBLICATIONS

Communication dated May 2, 2017 by the Korean Intellectual Property Office in counterpart Korean Patent Application No. 10-2016-0005991.

Communication dated May 8, 2017 by the International Searching Authority in counterpart International Patent Application No. PCT/KR2017/000518.

* cited by examiner

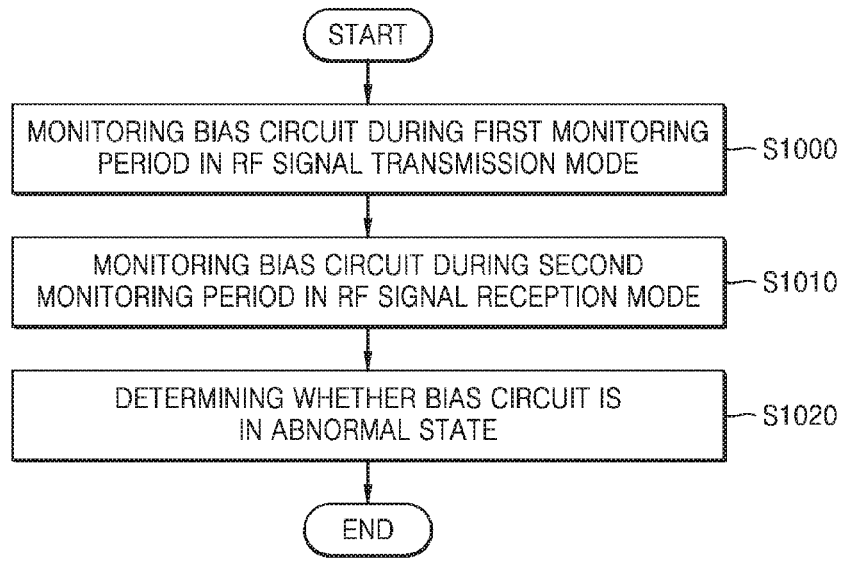
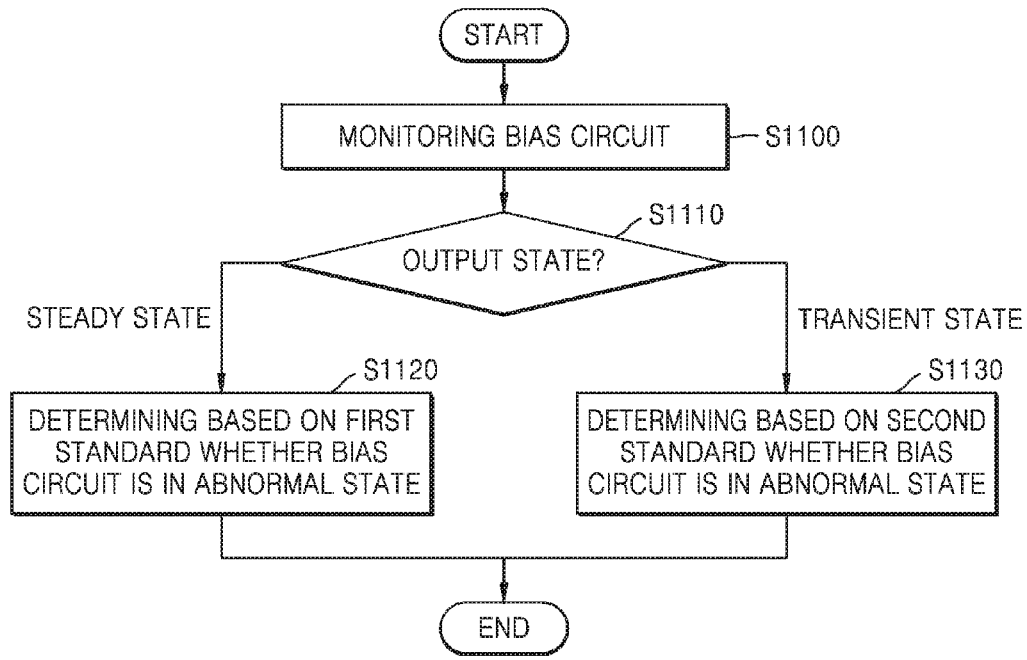

MAGNETIC RESONANCE IMAGING APPARATUS AND METHOD FOR DETECTING ERROR OF MAGNETIC RESONANCE IMAGING APPARATUS

CROSS-REFERENCE TO RELATED APPLICATION

This application claims priority from Korean Patent Application No. 10-2016-0005991, filed on Jan. 18, 2016, in the Korean Intellectual Property Office, the disclosure of which is incorporated herein by reference in its entirety.

BACKGROUND

1. Field

Apparatuses and methods consistent with example embodiments relate to magnetic resonance imaging (MRI) apparatuses and methods of detecting errors of the MRI apparatuses, and more particularly, to MRI apparatuses and methods of detecting errors of a bias circuit of the MRI apparatuses.

2. Description of the Related Art

A magnetic resonance imaging (MRI) apparatus uses a magnetic field to image an object, and is widely used for the accurate diagnosis of diseases because it is capable of showing stereoscopic images of bones, lumbar discs, joints, and nerve ligaments at desired angles.

The MRI apparatus is configured to acquire magnetic resonance (MR) signals and reconstruct the acquired MR signals into an image to be output. The MRI apparatus may acquire MR signals by using a radio frequency (RF) multi-coil, a permanent magnet, and a gradient coil.

In detail, by using a pulse sequence for generating RF signals, RF signals may be applied to an object via the RF multi-coil, and an MR image may be reconstructed by sampling MR signals generated in response to the RF signals applied to the object.

Wireless communication between a gantry in a shield room and a central controller in an operating room has been studied. Noise generated due to analog cables may be reduced by performing digital conversion of MR signals in the shield room. That is, the central controller may wirelessly control decoupling of an RF coil and receiving of MR signals, amplification, demodulation, and digital conversion of the MR signals received through the RF coil may be performed in the shield room, and then the converted digital signals may be transmitted through a wireless channel to the central controller and a signal processor.

When an error occurs in an MRI apparatus due to a malfunction, problem, defect, or degradation, the quality of MR images may degenerate. Furthermore, the error may affect a patient who is being scanned in the MRI apparatus and a user who is controlling the MRI apparatus.

SUMMARY

Example embodiments may address at least the above problems and/or disadvantages and other disadvantages not described above. Also, the example embodiments are not required to overcome the disadvantages described above, and may not overcome any of the problems described above.

Example embodiments provide a magnetic resonance imaging (MRI) apparatus and a method of detecting an error of the MRI apparatus.

According to an aspect of an example embodiment, there is provided a magnetic resonance imaging (MRI) apparatus including a radio frequency (RF) coil configured to transmit and receive an RF signal, a bias circuit configured to tune and detune the RF coil, and a monitoring circuit configured to monitor a parameter among a bias voltage and a bias current of the bias circuit, based on a monitoring pattern. The apparatus further includes a controller configured to determine whether the bias circuit is in an abnormal state, based on a determination criteria and the monitored parameter, and either one or both of the monitoring pattern and the determination criteria vary based on a status of the bias circuit.

The bias circuit may be further configured to detune the RF coil in a RF signal transmission mode, and tune the RF coil in a RF signal reception mode, and either one or both of the monitoring pattern and the determination criteria may vary between the RF signal transmission mode and the RF signal reception mode.

The monitoring circuit may be further configured to monitor, in the RF signal transmission mode, the parameter among the bias voltage and the bias current during a first monitoring time period that is shorter than a duration of the RF signal transmission mode, and monitor, in the RF signal reception mode, the either one or both of the bias voltage and the bias current during a second monitoring time period that is shorter than a duration of the RF signal reception mode.

The first monitoring time period may start after a first delay time period after the RF signal transmission mode starts, and the second monitoring time period may start after a second delay time period after the RF signal reception mode starts.

The first delay time period may be longer than the second delay time period.

The first monitoring time period may start after the bias circuit is switched off, and the second monitoring time period may start after the bias circuit is switched on.

The bias circuit may be in a steady state or a transient state, and the monitoring circuit may be further configured to monitor the parameter among the bias voltage and the bias current of the bias circuit in the steady state.

The controller may be further configured to determine whether the bias circuit is in the abnormal state by comparing the monitored parameter among the bias voltage and the bias current with first threshold values, in response to the bias circuit being in the steady state, and determine whether bias circuit is in the abnormal state by comparing a rising time period and a falling time period of the monitored parameter with second threshold values, in response to the bias circuit being in the transient state.

The controller may be further configured to determine whether the bias circuit is in the abnormal state by comparing the monitored parameter among the bias voltage and the bias current with threshold values.

The bias circuit may be in a steady state or a transient state, and the monitoring circuit may be further configured to monitor the parameter among the bias voltage and the bias current of the bias circuit in the transient state.

The controller may be further configured to determine whether the bias circuit is in the abnormal state, based on a rising time period and a falling time period of the monitored parameter among the bias voltage and the bias current.

The controller may be further configured to determine whether the bias circuit is in the abnormal state, based on a trend of a change in the rising time period and the falling time period.

The bias circuit may be in a steady state or a transient state, and either one or both of the monitoring pattern and the determination criteria may vary between the steady state and the transient state.

The controller may be further configured to determine whether the bias circuit is in the abnormal state, based on magnitudes of the monitored parameter among the bias voltage and the bias current, in response to the bias circuit being in a steady state, and determine whether the bias circuit is in the abnormal state, based on a rising time period and a falling time period of the monitored parameter, in response to the bias circuit being in a transient state.

The controller may be further configured to determine whether the bias circuit is in the abnormal state, based on a trend of a change in the rising time period and the falling time period.

The bias circuit may be further configured to detune the RF coil in a RF signal transmission mode, and tune the RF coil in a RF signal reception mode, and the monitoring circuit may be further configured to monitor the parameter among the bias voltage and the bias current, during a first monitoring time period in the RF signal transmission mode, during a second monitoring time period in the RF signal reception mode, and during a third monitoring time period while the bias circuit is being switched between the RF signal transmission mode and the RF signal reception mode, the first monitoring time period and the second monitoring time period being respectively shorter than a duration of the RF signal transmission mode and a duration of the RF signal reception mode.

The bias circuit may be in the steady state during the first monitoring time period and during the second monitoring time period, and may be in the transient state during the third monitoring time period.

The bias circuit may include a positive-intrinsic-negative diode.

According to an aspect of another example embodiment, there is provided a method of detecting an error of a magnetic resonance imaging apparatus including a radio frequency (RF) coil transmitting and receiving an RF signal, and a bias circuit tuning and detuning the RF coil. The method includes monitoring a parameter among a bias voltage and a bias current of the bias circuit, based on a monitoring pattern, and determining whether the bias circuit is in an abnormal state, based on a determination criteria and the monitored parameter. Either one or both of the monitoring pattern and the determination criteria vary based on a status of the bias circuit.

A non-transitory computer-readable storage medium may store a program to cause a computer to perform the method.

According to an aspect of another example embodiment, there is provided a magnetic resonance imaging apparatus including a radio frequency (RF) coil configured to transmit and receive an RF signal, and a bias circuit configured to detune the RF coil to transmit the RF signal, and tune the RF coil to receive the RF signal. The apparatus further includes a monitoring circuit configured to monitor a parameter among a bias voltage and a bias current of the bias circuit, during a first monitoring time period after a first delay time period after the detuning of the RF coil starts, and monitor the parameter during a second monitoring time period after a second delay time period after the tuning of the RF coil starts. The apparatus further includes a controller configured to determine that the bias circuit is in an abnormal state, based on the monitored parameter being outside a first threshold range during the first monitoring period, and determine that the bias circuit is in the abnormal state, based on the monitored parameter being outside a second threshold range during the second monitoring period.

The monitoring circuit may be further configured to monitor the parameter during a third monitoring time period while the bias circuit is being switched between the detuning and the tuning of the RF coil, and the controller may be further configured to determine that the bias circuit is in the abnormal state, based on the third monitoring time period of the monitored parameter being greater than a threshold value.

The monitoring circuit may include an active element configured to compare the monitored parameter to the first threshold range or the second threshold range to determine whether monitored parameter is outside the first threshold range or the second threshold range.

BRIEF DESCRIPTION OF THE DRAWINGS

The above and/or other aspects will be more apparent by describing example embodiments with reference to the accompanying drawings.

FIG. 10 is a flowchart of a method of detecting an error of an MRI apparatus, according to an example embodiment.

FIG. 11 is a flowchart of a method of detecting an error of an MRI apparatus, according to another example embodiment.

DETAILED DESCRIPTION

Figure 1:
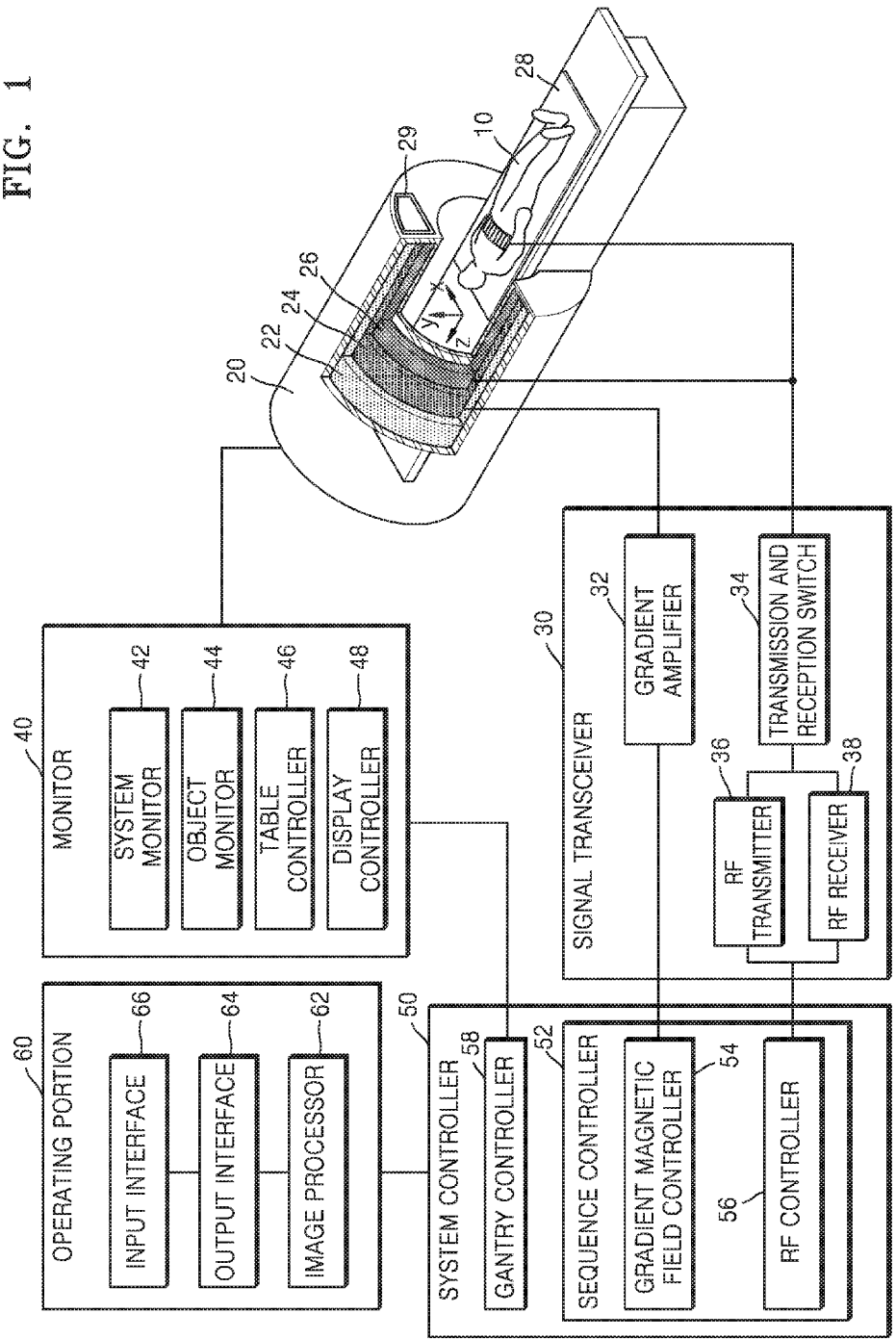
FIG. 1 is a block diagram of a general magnetic resonance imaging (MRI) system.

Example embodiments are described in greater detail below with reference to the accompanying drawings.

In the following description, like drawing reference numerals are used for like elements, even in different drawings. The matters defined in the description, such as detailed construction and elements, are provided to assist in a comprehensive understanding of the example embodiments. However, it is apparent that the example embodiments can be practiced without those specifically defined matters. Also, well-known functions or constructions may not be described in detail because they would obscure the description with unnecessary detail.

Terms used herein will now be briefly described and then the example embodiments will be described in detail.

All terms including descriptive or technical terms that are used herein may be construed as having meanings that are obvious to one of ordinary skill in the art. However, the terms may have different meanings according to the intention of one of ordinary skill in the art, precedent cases, or the appearance of new technologies. Also, some terms may be arbitrarily selected by the applicant, and in this case, the meaning of the selected terms will be described in detail in the detailed description. Thus, the terms used herein have to be defined based on the meaning of the terms together with the description throughout the specification.

In the present disclosure, it may be understood that the terms "comprises," "comprising," "including," and "having" are inclusive and therefore specify the presence of stated features or components, but do not preclude the presence or addition of one or more other features or components. Also, the term "unit" of the example embodiments means a software component or hardware component such as a field-programmable gate array (FPGA) or an application-specific integrated circuit (ASIC), and performs a specific function. However, the term "unit" is not limited to software or hardware. The "unit" may be formed to be in an addressable storage medium, or may be formed to operate one or more processors. Thus, for example, the term "unit" may refer to components such as software components, object-oriented software components, class components, and task components, and may include processes, functions, attributes, procedures, subroutines, segments of program code, drivers, firmware, micro codes, circuits, data, a database, data structures, tables, arrays, or variables. A function provided by the components and "units" may be associated with the smaller number of components and "units," or may be divided into additional components and "units."

In the present disclosure, an "image" may refer to multi-dimensional data composed of discrete image elements (e.g., pixels in a two-dimensional (2D) image and voxels in a three-dimensional (3D) image). For example, the image may be a medical image of an object captured by an X-ray apparatus, a computed tomography (CT) apparatus, a magnetic resonance imaging (MRI) apparatus, an ultrasound diagnosis apparatus, or another medical imaging apparatus.

In the present disclosure, an "object" may be a human, an animal, or a part of a human or animal. For example, the object may be an organ (e.g., the liver, the heart, the womb, the brain, a breast, or the abdomen), a blood vessel, or a combination thereof. In the present disclosure, the "object" may be a phantom. The phantom means a material having a density, an effective atomic number, and a volume that are approximately the same as those of an organism. For example, the phantom may be a spherical phantom having properties similar to the human body.

In the present disclosure, a "user" may be, but is not limited to, a medical expert, such as a medical doctor, a nurse, a medical laboratory technologist, and a technician who repairs a medical apparatus.

In the present disclosure, an "MR image" refers to an image of an object obtained by using the nuclear magnetic resonance principle.

In the present disclosure, a "pulse sequence" refers to continuity of signals repeatedly applied by an MRI apparatus. The pulse sequence may include a time parameter of a radio frequency (RF) pulse, for example, repetition time (TR) or echo time (TE).

In the present disclosure, a "pulse sequence schematic diagram" shows an order of events that occur in an MRI apparatus. For example, the pulse sequence schematic diagram may be a diagram showing an RF pulse, a gradient magnetic field, an MR signal, or the like according to time.

In the present disclosure, "tuning" refers to setting or adjusting a resonance frequency of an RF coil of an MRI apparatus while MR signals are being received through the RF coil. Signal intensity of an MR signal may be smaller than that of an RF signal that is generated and transmitted by the MRI apparatus. The MR signal may be effectively received through the RF coil tuned at a resonance frequency. The "tuning" may be referred to as "coupling."

In the present disclosure, "detuning" refers to controlling an RF coil to prevent it from being damaged by an RF signal. For example, the detuning may involve cutting the power supply to the RF coil, generating a high impedance to block a current to the RF coil, or setting or adjusting a frequency of a receiving channel or a receiving frequency of the RF coil to another frequency that differs from the RF signal.

In the present disclosure, a "bias circuit" refers to a circuit for the above tuning and detuning, and may be referred to as a "detuning circuit" or a "tuning circuit." The bias circuit may be embodied by an active circuit and/or a passive circuit. The active circuit operates using an external power supply, and the passive circuit operates without an external power supply and may operate by a voltage induced by an RF signal.

An MRI system is an apparatus for acquiring a sectional image of a part of an object by expressing, in a contrast comparison, a strength of a MR signal with respect to a radio frequency (RF) signal generated in a magnetic field having a strength. For example, if an RF signal that only resonates a specific atomic nucleus (for example, a hydrogen atomic nucleus) is emitted for an instant toward the object placed in a strong magnetic field and then such emission stops, an MR signal is emitted from the specific atomic nucleus, and thus the MRI system may receive the MR signal and acquire an MR image. The MR signal denotes an RF signal emitted from the object. An intensity of the MR signal may be determined according to a density of a predetermined atom (for example, hydrogen) of the object, a relaxation time T1, a relaxation time T2, and a flow of blood or the like.

A water molecule consists of two hydrogen atoms bonded to an oxygen atom, and humans are made up of over 70% water. Thus, intensity MR signals of atomic nuclei of hydrogen is greater than that of other atomic nuclei. An MR image may be generated based on MR signals of atomic nuclei of hydrogen.

MRI systems include characteristics different from those of other imaging apparatuses. Unlike imaging apparatuses such as CT apparatuses that acquire images according to a direction of detection hardware, MRI systems may acquire 2D images or 3D volume images that are oriented toward an optional point. MRI systems do not expose objects or examiners to radiation, unlike CT apparatuses, X-ray apparatuses, position emission tomography (PET) apparatuses, and single photon emission CT (SPECT) apparatuses, may acquire images having high soft tissue contrast, and may acquire neurological images, intravascular images, musculoskeletal images, and oncologic images that are used to precisely capturing abnormal tissues.

FIG. 1 is a block diagram of a general MRI system.

Referring to FIG. 1, the general MRI system may include a gantry 20, a signal transceiver 30, a monitor 40, a system controller 50, and an operating portion 60.

The gantry 20 prevents external emission of electromagnetic waves generated by a main magnet 22, a gradient coil 24, and an RF coil 26. A magnetostatic field and a gradient magnetic field are formed at a bore in the gantry 20, and an RF signal is emitted toward an object 10.

The main magnet 22, the gradient coil 24, and the RF coil 26 may be arranged in a predetermined direction of the gantry 20. The predetermined direction may be a coaxial cylinder direction. The object 10 may be disposed on a table 28 that is capable of being inserted into a cylinder along a horizontal axis of the cylinder.

The main magnet 22 generates a magnetostatic field or a static magnetic field for aligning magnetic dipole moments of atomic nuclei of the object 10 in a constant direction. A precise and accurate MR image of the object 10 may be obtained due to a magnetic field generated by the main magnet 22 being strong and uniform.

Examples of magnets for generating a static magnetic field may include a permanent magnet, a room-temperature electromagnet, or a superconducting electromagnet, but are not limited thereto. A superconducting electromagnet that produces a strong, highly uniform field may be mainly used as the main magnet 22. When hydrogen atoms in the human body are placed within a static magnetic field generated by the main magnet 22, magnetic dipole moments of nuclei of the hydrogen atoms may be aligned in a direction of the static magnetic field to transit to a lower energy state. To maintain a thermal equilibrium state, the number of atomic nuclei in a low energy state may be greater than the number of atomic nuclei in a high energy state. An energy difference between of atomic nuclei in different energy states is proportional to a strength of a magnetic field, and corresponds to a Larmor frequency. For example, if a magnetic field generated by the main magnet 22 has a strength of 1 tesla, a nucleus of a hydrogen atom has a Larmor frequency of about 42.58 MHz in the magnetic field.

The gradient coil 24 includes X, Y, and Z coils for generating gradient magnetic fields in X-, Y-, and Z-axis directions crossing each other at right angles. The gradient coil 24 may provide location information of each region of the object 10 by differently inducing resonance frequencies according to the regions of the object 10.

The RF coil 26 may emit an RF signal toward a patient and receive an MR signal emitted from the patient. In detail, the RF coil 26 may transmit, toward atomic nuclei included in the patient and having precessional motion, an RF signal having the same frequency as that of the precessional motion, stop transmitting the RF signal, and then receive an MR signal emitted from the atomic nuclei included in the patient.

For example, to transit an atomic nucleus from a low energy state to a high energy state, the RF coil 26 may generate and apply an electromagnetic wave signal having an RF corresponding to a type of the atomic nucleus, for example, an RF signal, to the object 10. When the electromagnetic wave signal generated by the RF coil 26 is applied to the atomic nucleus, the atomic nucleus may transit from the low energy state to the high energy state. Then, after electromagnetic waves stop being generated by the RF coil 26, the atomic nucleus to which the electromagnetic waves were applied transits from the high energy state to the low energy state, thereby emitting electromagnetic waves having a Larmor frequency. In other words, when the applying of the electromagnetic wave signal to the atomic nucleus is stopped, an energy level of the atomic nucleus is changed from a high energy level to a low energy level, and thus the atomic nucleus may emit electromagnetic waves having a Larmor frequency. The RF coil 26 may receive electromagnetic wave signals from atomic nuclei included in the object 10. The received electromagnetic wave signals may be referred to as free induction decay (FID) signals.

The RF coil 26 may be realized as one RF transmitting and receiving coil having both a function of generating electromagnetic waves having an RF corresponding to a type of an atomic nucleus and a function of receiving electromagnetic waves emitted from an atomic nucleus. Alternatively, the RF coil 26 may be realized as a transmission RF coil having a function of generating electromagnetic waves having an RF corresponding to a type of an atomic nucleus, and a reception RF coil having a function of receiving electromagnetic waves emitted from an atomic nucleus.

The RF coil 26 may be fixed to the gantry 20 or may be detachable. When the RF coil 26 is detachable, the RF coil 26 may be an RF coil for a part of the object, such as a head RF coil, a chest RF coil, a leg RF coil, a neck RF coil, a shoulder RF coil, a wrist RF coil, or an ankle RF coil.

The RF coil 26 may communicate with an external apparatus via wires and/or wirelessly, and may also perform dual tune communication according to a communication frequency band.

The RF coil 26 may be a birdcage coil, a surface coil, or a transverse electromagnetic (TEM) coil according to structures.

The RF coil 26 may be a transmission exclusive coil, a reception exclusive coil, or a transmission and reception coil according to methods of transmitting and receiving an RF signal.

The RF coil 26 may be a multi-channel RF coil, such as a 16 channel-coil, a 32 channel-coil, a 72 channel-coil, and a 144 channel-coil.

The gantry 20 may further include a display 29 disposed outside the gantry 20 and a display disposed inside the gantry 20. The gantry 20 may provide predetermined information to the user or the object 10 through the display 29 and the display respectively disposed outside and inside the gantry 20.

The signal transceiver 30 may control the gradient magnetic field formed inside the gantry 20, i.e., in the bore, according to a predetermined MR sequence, and control transmission and reception of an RF signal and an MR signal.

The signal transceiver 30 may include a gradient amplifier 32, a transmission and reception switch 34, an RF transmitter 36, and an RF receiver 38.

The gradient amplifier 32 drives the gradient coil 24 included in the gantry 20, and may supply a pulse signal for generating a gradient magnetic field to the gradient coil 24 under the control of a gradient magnetic field controller 54. By controlling the pulse signal supplied from the gradient amplifier 32 to the gradient coil 24, gradient magnetic fields in X-, Y-, and Z-axis directions may be synthesized.

The RF transmitter 36 and the RF receiver 38 may drive the RF coil 26. The RF transmitter 36 may supply an RF pulse in a Lamor frequency to the RF coil 26, and the RF receiver 38 may receive an MR signal received by the RF coil 26.

The transmission and reception switch 34 may adjust transmitting and receiving directions of the RF signal and the MR signal. For example, the transmission and reception switch 34 may emit the RF signal toward the object 10 through the RF coil 26 during a transmission mode, and receive the MR signal from the object 10 through the RF coil 26 during a reception mode. The transmission and reception switch 34 may be controlled by a control signal output by an RF controller 56.

The monitor 40 may monitor or control the gantry 20 or devices mounted on the gantry 20. The monitor 40 may include a system monitor 42, an object monitor 44, a table controller 46, and a display controller 48.

The system monitor 42 may monitor and control a state of the magnetostatic field, a state of the gradient magnetic field, a state of the RF signal, a state of the RF coil 26, a state of the table 28, a state of a device measuring body information of the object 10, a power supply state, a state of a thermal exchanger, and a state of a compressor.

The object monitor 44 monitors a state of the object 10. In detail, the object monitor 44 may include a camera for observing a movement or position of the object 10, a respiration measurer for measuring the respiration of the object 10, an electrocardiogram (ECG) measurer for measuring the electrical activity of the object 10, or a temperature measurer for measuring a temperature of the object 10.

The table controller 46 controls a movement of the table 28 where the object 10 is positioned. The table controller 46 may control the movement of the table 28 according to a sequence control of a sequence controller 52. For example, during moving imaging of the object 10, the table controller 46 may continuously or discontinuously move the table 28 according to the sequence control of the sequence controller 52, and thus the object 10 may be photographed in a field of view (FOV) larger than that of the gantry 20.

The display controller 48 controls the display 29 disposed outside the gantry 20 and the display disposed inside the gantry 20. In detail, the display controller 48 may control the display 29 and the display to be on or off, and may control a screen image to be output on the display 29 and the display. Also, when a speaker is located inside or outside the gantry 20, the display controller 48 may control the speaker to be on or off, or may control sound to be output via the speaker.

The system controller 50 may include the sequence controller 52 for controlling a sequence of signals formed in the gantry 20, and a gantry controller 58 for controlling the gantry 20 and the devices mounted on the gantry 20.

The sequence controller 52 may include the gradient magnetic field controller 54 for controlling the gradient amplifier 32, and the RF controller 56 for controlling the RF transmitter 36, the RF receiver 38, and the transmission and reception switch 34. The sequence controller 52 may control the gradient amplifier 32, the RF transmitter 36, the RF receiver 38, and the transmission and reception switch 34 according to a pulse sequence received from the operating portion 60. Here, the pulse sequence includes all information used to control the gradient amplifier 32, the RF transmitter 36, the RF receiver 38, and the transmission and reception switch 34. For example, the pulse sequence may include information for strength, an application time, and application timing of a pulse signal applied to the gradient coil 24.

The operating portion 60 may request the system controller 50 to transmit pulse sequence information while controlling an overall operation of the MRI system.

The operating portion 60 may include an image processor 62 for receiving and processing the MR signal received by the RF receiver 38, an output interface 64, and an input interface 66.

The image processor 62 may process the MR signal received from the RF receiver 38 to generate MR image data of the object 10.

The image processor 62 receives the MR signal received by the RF receiver 38 and performs any one of various signal processes, such as amplification, frequency transformation, phase detection, low frequency amplification, and filtering, on the received MR signal.

The image processor 62 may arrange digital data in a K-space that may be referred to as a Fourier space or a frequency space, and perform two dimensional or three dimensional Fourier transform to reconstruct an image data.

The image processor 62 may perform a composition process or a difference calculation process on the image data. The composition process may be an addition process performed on a pixel or a maximum intensity projection (MIP) process performed on a pixel. The image processor 62 may store not only the rearranged image data but also image data on which a composition process or a difference calculation process is performed, in a memory or an external server.

The image processor 62 may perform any of the signal processes on the MR signal in parallel. For example, the image processor 62 may perform a signal process on a plurality of MR signals received by a multi-channel RF coil in parallel to rearrange the plurality of MR signals into image data.

The output interface 64 may output image data generated or rearranged by the image processor 62 to the user. The output interface 64 may also output information used for the user to manipulate the MRI system, such as a user interface (UI), user information, or object information. The output interface 64 may be a speaker, a printer, a cathode-ray tube (CRT) display, a liquid crystal display (LCD), a plasma display panel (PDP), an organic light-emitting device (OLED) display, a field emission display (FED), a light-emitting diode (LED) display, a vacuum fluorescent display (VFD), a digital light processing (DLP) display, a flat panel display (FPD), a 3-dimensional (3D) display, a transparent display, or any one of other various output devices that are well known to one of ordinary skill in the art.

The user may input object information, parameter information, a scan condition, a pulse sequence, or information about image composition or difference calculation by using the input interface 66. The input interface 66 may be a keyboard, a mouse, a track ball, a voice recognizer, a gesture recognizer, a touch screen, or any one of other various input devices that are well known to one of ordinary skill in the art.

The signal transceiver 30, the monitor 40, the system controller 50, and the operating portion 60 are separate components in FIG. 1, but it will be obvious to one of ordinary skill in the art that respective functions of the signal transceiver 30, the monitor 40, the system controller 50, and the operating portion 60 may be performed by another component. For example, the image processor 62 converts the MR signal received from the RF receiver 38 into a digital signal in FIG. 1, but alternatively, the conversion of the MR signal into the digital signal may be performed by the RF receiver 38 or the RF coil 26.

The gantry 20, the RF coil 26, the signal transceiver 30, the monitor 40, the system controller 50, and the operating portion 60 may be connected to each other by wire or wirelessly, and when they are connected wirelessly, the MRI system may further include an apparatus for synchronizing clock signals therebetween. Communication between the gantry 20, the RF coil 26, the signal transceiver 30, the monitor 40, the system controller 50, and the operating portion 60 may be performed by using a high-speed digital interface, such as low voltage differential signaling (LVDS), asynchronous serial communication, such as a universal asynchronous receiver transmitter (UART), a low-delay network protocol, such as error synchronous serial communication or a controller area network (CAN), optical communication, or any of other various communication methods that are well known to one of ordinary skill in the art.

The MRI system may further include a communication interface.

Figure 2:
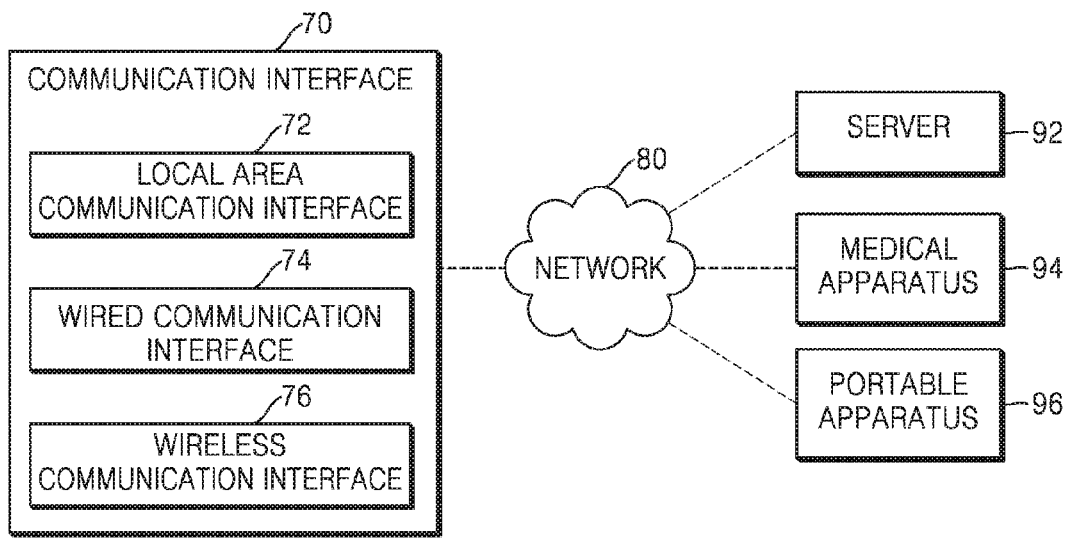
FIG. 2 is a block diagram of a communication interface according to an example embodiment.

FIG. 2 is a block diagram of a communication interface 70 according to an example embodiment.

Referring to FIG. 2, the communication interface 70 may be connected to at least one selected from the gantry 20, the signal transceiver 30, the monitor 40, the system controller 50, and the operating portion 60 of FIG. 1.

The communication interface 70 may transmit and receive data to and from a hospital server or another medical apparatus in a hospital, which is connected through a picture archiving and communication system (PACS), and perform data communication according to the digital imaging and communications in medicine (DICOM) standard.

As shown in FIG. 2, the communication interface 70 may be connected to a network 80 by wire or wirelessly to communicate with a server 92, a medical apparatus 94, or a portable apparatus 96.

In detail, the communication interface 70 may transmit and receive data related to the diagnosis of an object through the network 80, and may also transmit and receive a medical image captured by the medical apparatus 94, such as a CT apparatus, an MRI apparatus, or an X-ray apparatus. In addition, the communication interface 70 may receive a diagnosis history or a treatment schedule of the object from the server 92 and use the same to diagnose the object. The communication interface 70 may perform data communication not only with the server 92 or the medical apparatus 94 in a hospital, but also with the portable apparatus 96, such as a mobile phone, a personal digital assistant (PDA), or a laptop of a doctor or patient.

Also, the communication interface 70 may transmit information about a malfunction of the MRI system or about a medical image quality to a user through the network 80, and receive a feedback regarding the information from the user.

The communication interface 70 may include at least one component enabling communication with an external apparatus. For example, the communication interface 70 may include a local area communication interface 72, a wired communication interface 74, and a wireless communication interface 76.

The local area communication interface 72 refers to an interface for performing local area communication with an apparatus within a predetermined distance. Examples of local area communication technology according to an example embodiment of the present disclosure include, but are not limited to, a wireless local area network (LAN), Wi-Fi, Bluetooth, ZigBee, Wi-Fi direct (WFD), ultra wideband (UWB), infrared data association (IrDA), Bluetooth low energy (BLE), and near field communication (NFC).

The wired communication interface 74 refers to an interface for performing communication by using an electric signal or an optical signal. Examples of wired communication technology according to an example embodiment of the present disclosure include wired communication techniques using a twisted pair cable, a coaxial cable, and an optical fiber cable, and other well known wired communication techniques.

The wireless communication interface 76 transmits and receives a wireless signal to and from at least one selected from a base station, an external apparatus, and a server in a mobile communication network. Here, the wireless signal may be a voice call signal, a video call signal, or data in any one of various formats according to transmission and reception of a text/multimedia message.

Figure 3:
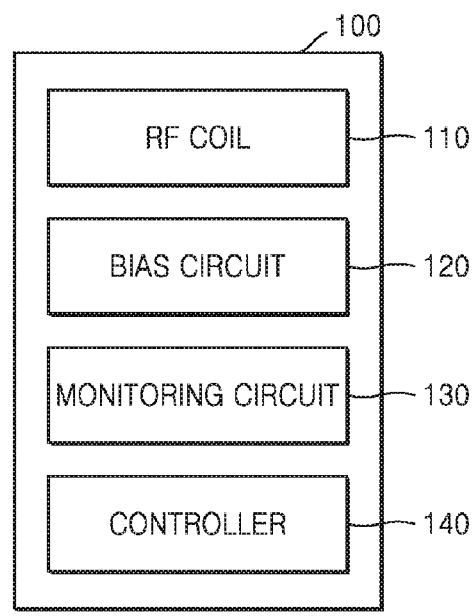
FIG. 3 is a block diagram of an MRI apparatus according to an example embodiment.

FIG. 3 is a block diagram of an MRI apparatus 100 according to an example embodiment.

Referring to FIG. 3, the MRI apparatus 100 may include an RF coil 110, a bias circuit 120, a monitoring circuit 130, and a controller 140.

The MRI apparatus 100 may be included in the MRI system that is described above by referring to FIG. 1. When the MRI apparatus 100 is included in the MRI system 1 of FIG. 1, the RF coil 110, the bias circuit 120, and the monitoring circuit 130 of the MRI apparatus 100 may correspond to or be included in an element of the MRI system 1 of FIG. 1.

Via the RF coil 110 of the MRI apparatus 100, an RF signal generated by the MRI apparatus 100 is transmitted and an MR signal emitted from an object is received. The RF signal is transmitted through the RF coil 110 when the MRI apparatus 100 operates in an RF signal transmission mode, and the MR signal is received through the RF coil when the MRI apparatus 100 operates in an RF signal reception mode.

The RF coil 110 of the MRI apparatus 100 may include a whole body coil (WBC) and a multi channel surface coil (MCSC). The RF coil 110 may be tuned or detuned based on an operating mode of the MRI apparatus 100. For example, the RF coil 110 may be detuned in the RF signal transmission mode and tuned in the RF signal reception mode. The RF coil 110 may be tuned or detuned by the bias circuit 120, and the bias circuit 120 may be electronically connected to the RF coil 110.

The bias circuit 120 may include at least one switching element. For example, the switching element may be a diode, e.g., a positive-intrinsic-negative (PIN) diode. The bias circuit 120 may tune or detune the RF coil 110 based on whether an RF signal is transmitted or received through the RF coil 110. The RF coil 110 may be detuned by the bias circuit 120 that is switched off, and tuned by the bias circuit 120 that is switched on, and vice versa. The bias circuit 120 of the MRI apparatus 100 may be switched by the PIN diode based on transmission and reception of the RF signal.

The bias circuit 120 of the MRI apparatus 100 according to an example embodiment may be an active circuit. For example, the bias circuit 120 as the active circuit may include at least one PIN diode. The bias circuit may be switched by the PIN diode that is supplied with power from a direct current (DC) power supply.

The bias circuit 120 of the MRI apparatus 100 according to an example embodiment may be a passive circuit. For example, the bias circuit 120 as the passive circuit may include at least two PIN diodes that are connected back-to-back in parallel. The bias circuit may be switched by the two PIN diodes using a voltage induced by an RF signal transmitted in an RF signal transmission mode.

Switching requirements of the bias circuit 120 may differ based on elements of the bias circuit 120, connectivity between the elements, a size or a type of a power supply connected to the bias circuit, etc.

The monitoring circuit 130 may monitor the bias circuit 120. The monitoring circuit 130 may monitor either one or both of a bias voltage and a bias current of the bias circuit 120. The bias voltage or bias current of the bias circuit 120 is monitored, so that whether the bias circuit 120 properly operates to tune or detune the RF coil 110 may be determined.

The controller 140 may determine, based on a monitoring result of the monitoring circuit 130, whether the bias circuit 120 is in an abnormal state. When the bias circuit 120 is in the abnormal state, the RF coil 110 may not be tuned or detuned by the bias circuit 120.

A patient or a user may be affected by an MRI apparatus having an RF coil that is not be tuned or detuned properly. For example, quality of an MR image produced by the MRI apparatus may degenerate, or the life of the MRI apparatus may decrease. The safety of the patient or user may be harmed by the MRI apparatus.

According to an example embodiment, the MRI apparatus 100 may determine whether the bias circuit 120 is in an abnormal state, thus, a patient or a user may avoid a potential danger.

The controller 140 may include a processor and a memory. The controller 140 may include any one or any combination of a central processing unit (CPU), a multi-core processor, a microprocessor, a micro-controller, a digital signal processor, a field-programmable gate array (FPGA), an application specific integrated circuit (ASIC), but is not limited thereto.

A memory may store software and/or a firmware application, and data that is used for the controller 140. The memory may include at least one tangible computer-readable medium.

According to an example embodiment, the MRI apparatus 100 may further include a high voltage control circuit. The high voltage control circuit may apply a voltage to the bias circuit 120 when the bias circuit 120 is determined to be in an abnormal state. When the voltage is applied to the bias circuit 120, the bias circuit 120 may be reverse-biased to be shut down.

Figure 4A:
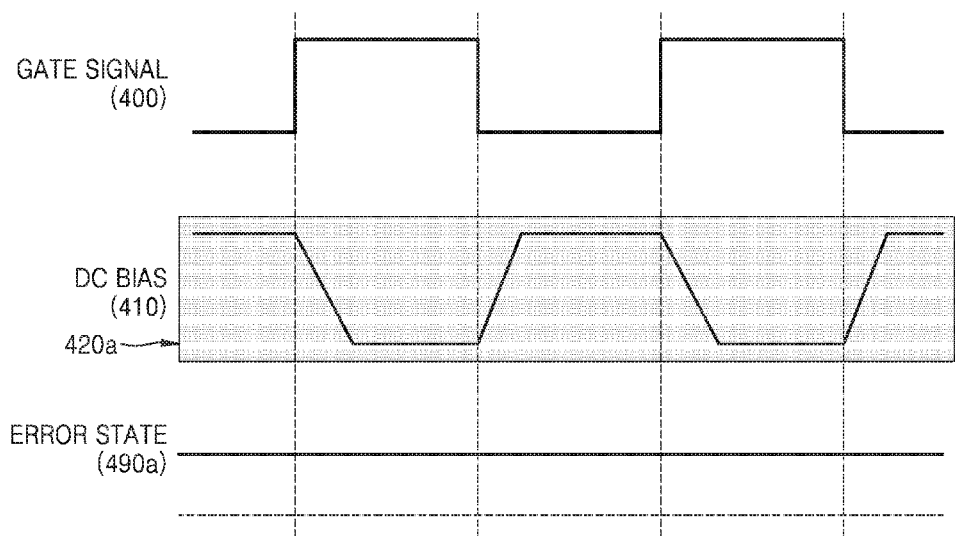
FIGS. 4A, 4B, and 4C are timing diagrams illustrating a method of determining whether an MRI apparatus is in an abnormal state, according to an example embodiment.
Figure 4B:
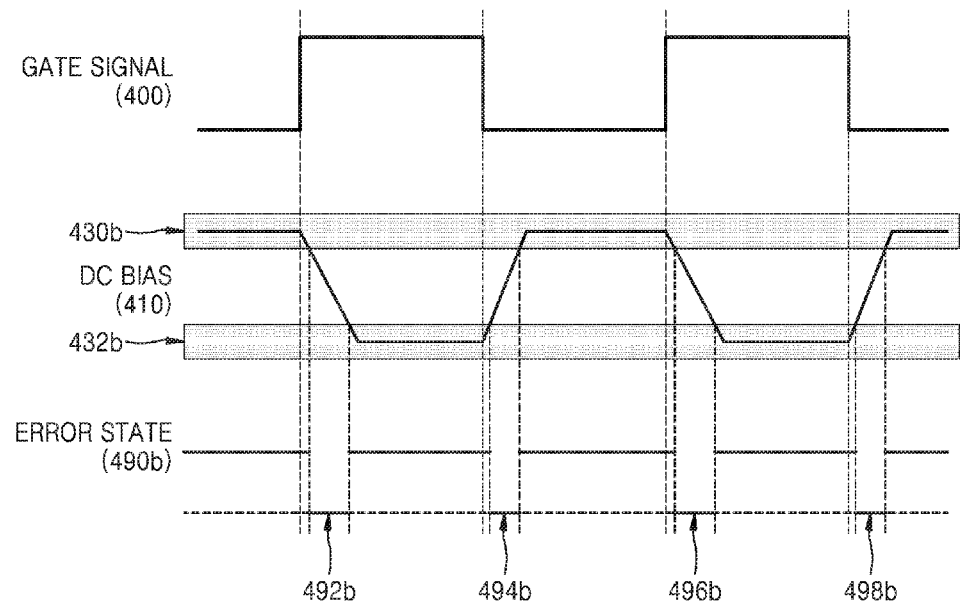
Figure 4C:
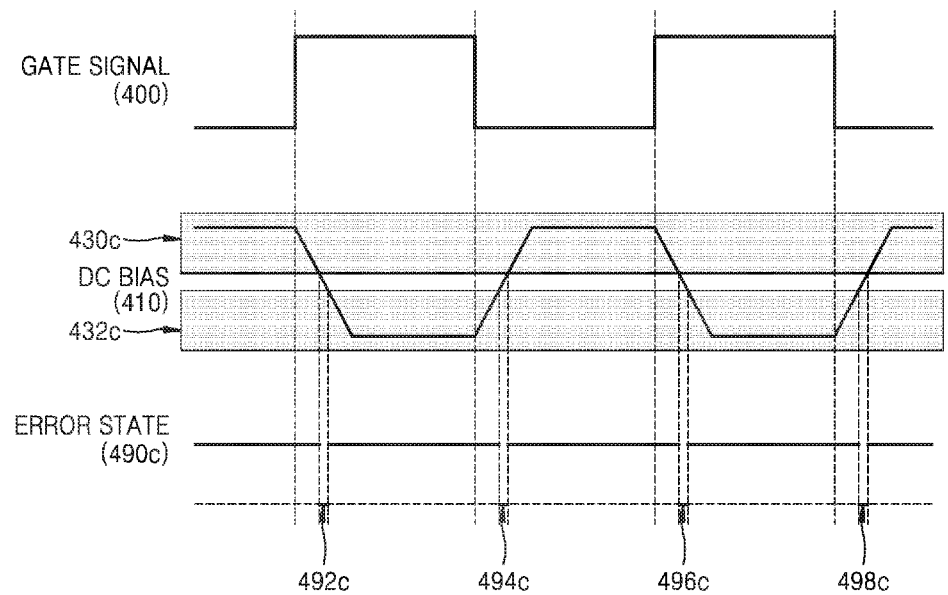

FIGS. 4A, 4B, and 4C are timing diagrams illustrating a method of determining whether an MRI apparatus is in an abnormal state, according to an example embodiment.

According to an example embodiment, an MRI apparatus may alternate between an RF signal transmission mode and an RF signal reception mode. A gate signal 400 applied to a bias circuit may alternate between high and low or on and off based on the RF signal transmission mode and the RF signal reception mode. For example, referring to FIG. 4A, the MRI apparatus may operate in the RF signal transmission mode when a status of the gate signal 400 is low, and operate in the RF signal reception mode when the status of the gate signal 400 is high.

According to an example embodiment, a bias circuit of an MRI apparatus may be switched based on an RF signal transmission mode and an RF signal reception mode. For example, referring to FIG. 4A, the bias circuit may be switched off in the RF signal transmission mode, and switched on in the RF signal reception mode.

According to an example embodiment, a DC bias 410 of a bias circuit may be forward-biased or reverse-biased based on an RF signal transmission mode and an RF signal transmission mode. For example, referring to FIG. 4A, the DC bias 410 of the bias circuit may be forward-biased in the RF signal transmission mode, and reverse-biased in the RF signal reception mode.

The DC bias 410 illustrated in the drawings, as well as in FIG. 4A, may be a bias voltage and/or bias current of the bias circuit. For example, the DC bias 410 may be the bias voltage, the bias current, the bias voltage in forward-bias and the bias current in a reverse-bias, or vice versa.

A bias circuit may be biased by a DC power supply. The bias circuit may be biased by a constant voltage or a constant current provided by the DC power supply. A magnitude and direction of the constant current and the constant voltage for forward-biasing or reverse-biasing the bias circuit may differ based on elements of the bias circuit, connectivity between the elements, a size or a type of a power supply connected to the bias circuit, etc.

According to an example embodiment, referring to FIG. 4A, a bias circuit may be monitored during a period of an RF signal transmission mode and an RF signal reception mode. According to one example embodiment, the DC bias 410 of the bias circuit may be monitored during the period of the RF signal transmission mode and the RF signal reception mode. According to one example embodiment, either one or both of the bias voltage and the bias current of the bias circuit may be monitored during the period of the RF signal transmission mode and the RF signal reception mode.

Referring to FIG. 4A, whether a bias circuit is in an abnormal state may be determined based on a result of monitoring the DC bias 410 during the period of an RF signal transmission mode and an RF signal reception mode. For example, whether the DC bias 410 exceeds a predetermined threshold range may be determined to determine whether the bias circuit is in the abnormal state. A predetermined threshold range 420a is illustrated as highlighted in FIG. 4A. Because the DC bias 410 does not exceed the highlighted range 420a during the period of the RF signal transmission mode and the RF signal reception mode, it may be determined that the bias circuit is not in the abnormal state. It may be determined that the bias circuit is in the abnormal state when an error state 490a is low. Furthermore, it may be determined that the bias circuit is not in the abnormal state, that is, is in a normal state, when the error state 490a is high. The threshold range may be prestored in the MRI apparatus.

Referring to FIG. 4A, a bias circuit may be monitored based on a threshold range during a period of an RF signal transmission mode and an RF signal reception mode. If forward-biased DC bias 410 is falling by an extent or reverse-biased DC bias 410 is rising by an extent, the bias circuit may be inappropriate to tune or detune an RF coil, even if the DC bias 410 is still within the threshold range.

According to an example embodiment, referring to FIG. 4B, an error state 490b of a bias circuit may be determined based on a first threshold range 430b and a second threshold range 432b during a period of an RF signal transmission mode and an RF signal reception mode.

Referring to FIG. 4B, whether the DC bias 410 exceeds the first and second threshold ranges 430b and 432b is determined when a bias circuit is biased and the DC bias 410 is in a steady state. Therefore, whether the bias circuit is capable of tuning or detuning an RF coil properly may be checked while transmitting and receiving an RF signal.

As illustrated in FIG. 4B, however, it may be determined that the bias circuit is in an abnormal state during periods 492b, 494b, 496b, and 498b in which the bias circuit is in a transient state to be switched on or off. That is, it may be determined that the bias circuit is in an abnormal state when it is not actually in such a state, while the bias circuit is being switched, and the DC bias 410 is in a transient state.

According to an example embodiment, referring to FIG. 4C, an error state 490c of a bias circuit may be determined based on a third threshold range 430c and a forth threshold range 432c during a period of an RF signal transmission mode and an RF signal reception mode.

As illustrated in FIG. 4C, the third and fourth threshold ranges 430c and 432c are wider than the first and second threshold ranges 430b and 432b, to thereby increase an accuracy of determination of whether an error has occurred during a period in which a bias circuit is being switched and the DC bias 410 is in a transient state. At least, it may be determined that the bias circuit is in an abnormal state during periods 492c, 494c, 496c, and 498c that are respectively shorter than periods 492*b*, 492*b*, 496*b*, and 498*b* of FIG. 4B, and the accuracy of the determination of whether an error has occurred may improve.

Figure 5A:
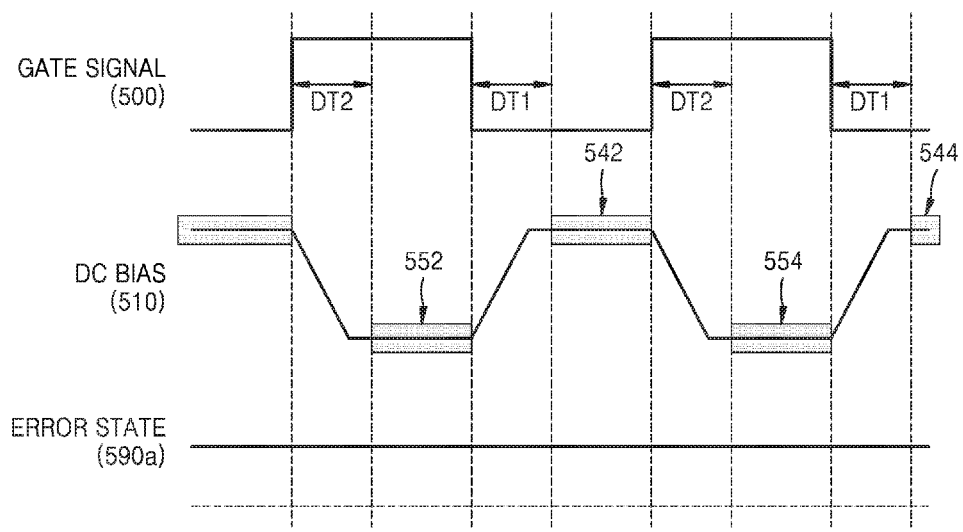
FIGS. 5A and 5B are timing diagrams illustrating a monitoring period, according to an example embodiment, during which a bias voltage of a bias circuit is monitored.
Figure 5B:
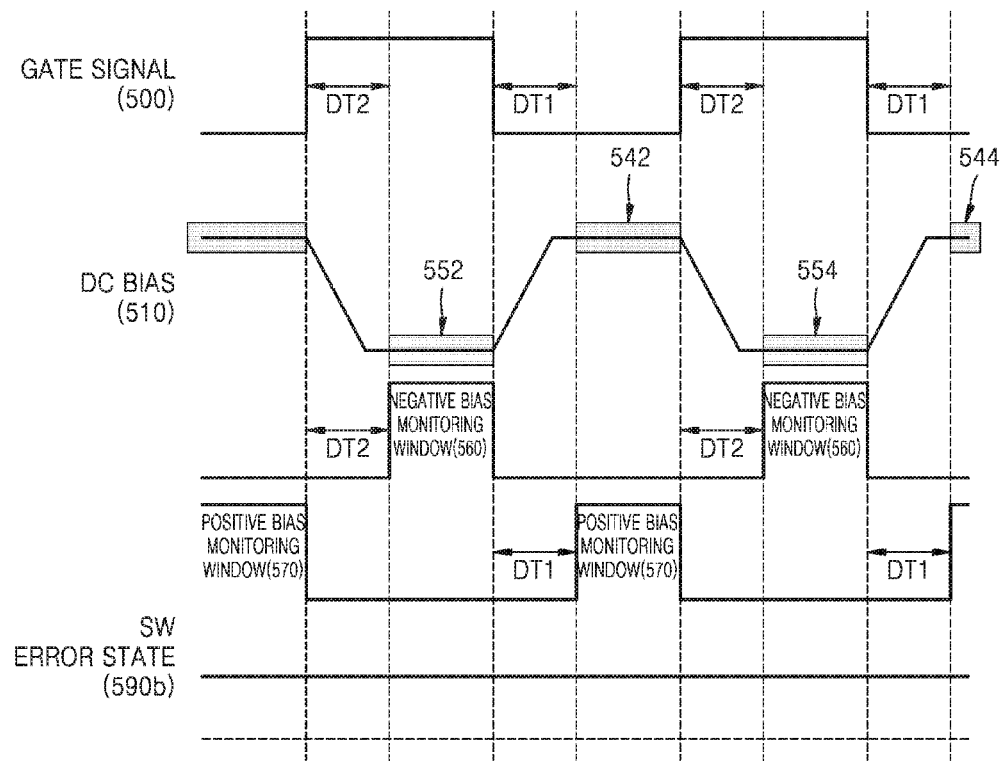

FIGS. 5A and 5B are timing diagrams illustrating a monitoring period, according to an example embodiment, during which a bias voltage of a bias circuit is monitored.

According to an example embodiment, an MRI apparatus may alternate between an RF signal transmission mode and an RF signal reception mode. A gate signal (500) applied to a bias circuit may alternate between high and low or on and off based on the RF transmission mode and the RF reception mode. For example, referring to FIG. 5A, the MRI apparatus may operate in the RF signal transmission mode when a status of the gate signal 500 is low, and operate in the RF signal reception mode when the status of the gate signal 500 is high.

According to an example embodiment, referring to FIG. 5A, a bias circuit may be monitored during partial periods 542 and 544 of a duration of an RF signal transmission mode and during partial periods 552 and 554 of a duration of an RF signal reception mode, and an error state 590*a* of the bias circuit may be determined based on a result of monitoring the bias circuit. A DC bias 510 monitored in the RF signal reception mode may be compared with a threshold value or a threshold range in which the bias circuit that is reverse-biased is expected to normally operate or be normally operable. Likewise, the DC bias 510 monitored in the RF signal transmission mode may be compared with a threshold value or a threshold range in which the bias circuit that is forward-biased is expected to normally operate or be normally operable. According to an example embodiment, it may be determined that the bias circuit is in a normal state when the bias circuit is not being monitored.

According to one example embodiment, starting points of partial periods 542, 544, 552, and 554 may be determined based on default or setting of an MRI apparatus, condition of the MRI apparatus, or its user. Ending points of the partial periods 542, 544, 552, and 554 may be determined based on default or setting of an MRI apparatus, condition of the MRI apparatus, or its user.

According to one example embodiment, the partial periods 542, 544, 552, and 554 may start or end from, or before or after a time from, a start or an end of an RF signal transmission mode or an RF signal reception mode, a status change of a gate signal 500, or switching of a bias circuit.

The partial periods 542 and 544 of the duration of the RF signal transmission mode may be referred to as first monitoring periods, and the partial periods 552 and 554 of the duration of RF signal reception mode may be referred to as second monitoring periods in the present disclosure.

According to one example embodiment, referring to FIG. 5A, the first monitoring periods 542 and 544 and the second monitoring periods 552 and 554 may start after a bias circuit has been switched off or on. A moment when the bias circuit is switched off or on may correspond to a moment when the bias circuit is ready to tune or detune an RF coil. The moment when the bias circuit is switched off or on may correspond to a moment at least after it is determined that the DC bias 510 of the bias circuit leaves a transient state or enters a steady state. The bias circuit may be in a steady state during the first and second periods 542, 544, 552, and 554.

According to an example embodiment, a bias circuit may start to be monitored after it is ready to tune or detune an RF coil, and thus, the bias circuit may be monitored more effectively than when it is monitored during a whole period of an RF signal transmission mode and an RF signal reception mode.

According to one example embodiment, referring to FIG. 5A, first monitoring periods 542 and 544 may start after a first delay time DT1 after an RF signal transmission mode starts, and second monitoring periods 552 and 554 may start after a second delay time DT2 after an RF signal reception mode starts. The first and second delay times DT1 and DT2 may be determined based on default or setting of an MRI apparatus, condition of the MRI apparatus, or its user.

According to one example embodiment, first and second delay times DT1 and DT2 may start or end from, or before or after a time from, a start or an end of an RF signal transmission mode or an RF signal reception mode, a status change of a gate signal 500, or switching of a bias circuit.

A first delay time DT1 and a second delay time DT2 may be a transmission delay time and a reception delay time. The transmission delay time may be longer than the reception delay time.

According to an example embodiment, the bias circuit is monitored after a transmission delay time and a reception delay time, and thus, the bias circuit may be monitored while transmitting and receiving an RF signal. Therefore, monitoring of an MRI apparatus may be achieved effectively.

According to one example embodiment, referring to FIG. 5B, a first monitoring period and a second monitoring period in which a bias circuit is monitored may be respectively selected as a positive bias monitoring window 570 and a negative bias monitoring window 560, and an error state 590*b* of the bias circuit may be determined based on a result of monitoring within windows 560 and 570.

Referring to FIG. 5B, the error state 590*b* of the bias circuit determined based on the result of the monitoring within the windows 560 and 570 may be a software error state.

Figure 6:
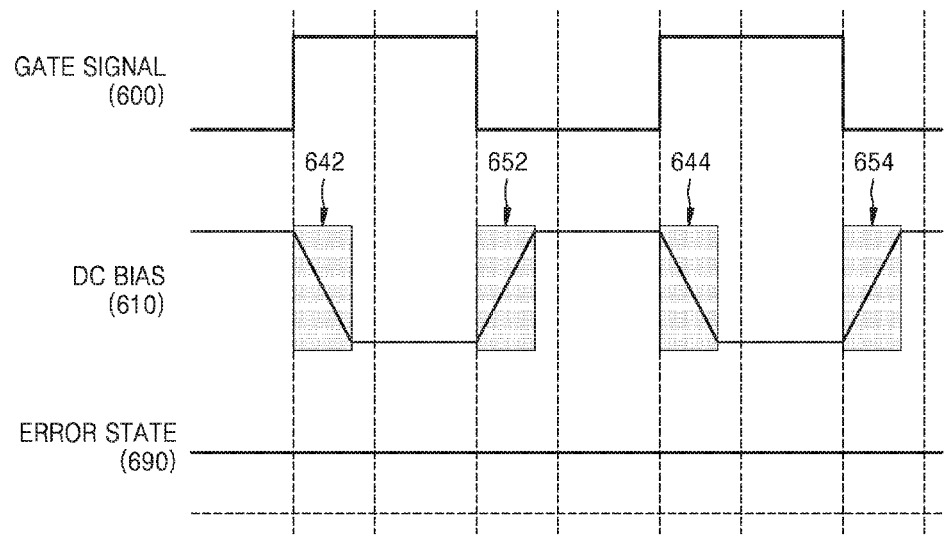
FIG. 6 is a timing diagram illustrating a monitoring period, according to an example embodiment, during which a rising time and a falling time of a bias voltage is monitored.

FIG. 6 is a timing diagram illustrating a monitoring period, according to an example embodiment, during which a rising time and a falling time of a bias voltage is monitored.

According to an example embodiment, referring to FIG. 6, a DC bias 610 of a bias circuit, which corresponds to a gate signal 600, may be monitored during partial periods 642 and 644 of a duration of an RF signal transmission mode and during partial periods 652 and 654 of a duration of an RF signal reception mode. The bias circuit may be in a transient state during the partial periods 642, 644, 652, and 654 in which the bias circuit is monitored. The partial periods 642, 644, 652, and 654 in which the bias circuit is monitored may continue while the bias circuit is being switched. An error state 690 of the bias circuit may be determined based on a result of monitoring the bias circuit.

According to one example embodiment, the time used for a bias of a bias circuit to transit from reverse-bias to forward-bias may be monitored during the RF signal transmission mode. Likewise, the time used for the bias of the bias circuit to transit from forward-bias to reverse-bias may be monitored during the RF signal reception mode. The time used for the bias of the bias circuit to transit may be referred to as a rising time and a falling time based on a transition direction.

The time used may be compared with a threshold value or a threshold range that is expected or estimated to be used for a bias circuit in a normal state. The threshold value and the threshold range may be prestored in an MRI apparatus. According to an example embodiment, it may be determined that the bias circuit is in a normal state when the bias circuit is not being monitored.

According to an example embodiment, whether a bias circuit is in an abnormal state may be determined based on a trend of a change in the rising time and the falling time.

Referring to FIG. 6, the trend of the change in the rising time and the falling time may refer to a trend regarding whether the rising time and the falling time shorten or lengthen. The trend of the change in the falling time may be determined based on comparing a falling time of the partial period 642 and a falling time of the partial period 644 in an RF signal reception mode. The trend of change in the rising time may be determined based on comparing a rising time of the partial period 652 and a rising time of the partial period 654 in an RF signal transmission mode. According to one example embodiment, it may be determined that the bias circuit is in an abnormal state when the trend of the change is faster than a threshold value. For example, it may be determined that the bias circuit is in the abnormal state when it is determined from the monitoring that the rising time or the falling time shortens faster than a speed. It may be determined that the bias circuit is in the abnormal state when it is determined from the monitoring that the rising time or the falling time lengthens faster than a speed.

Figure 7:
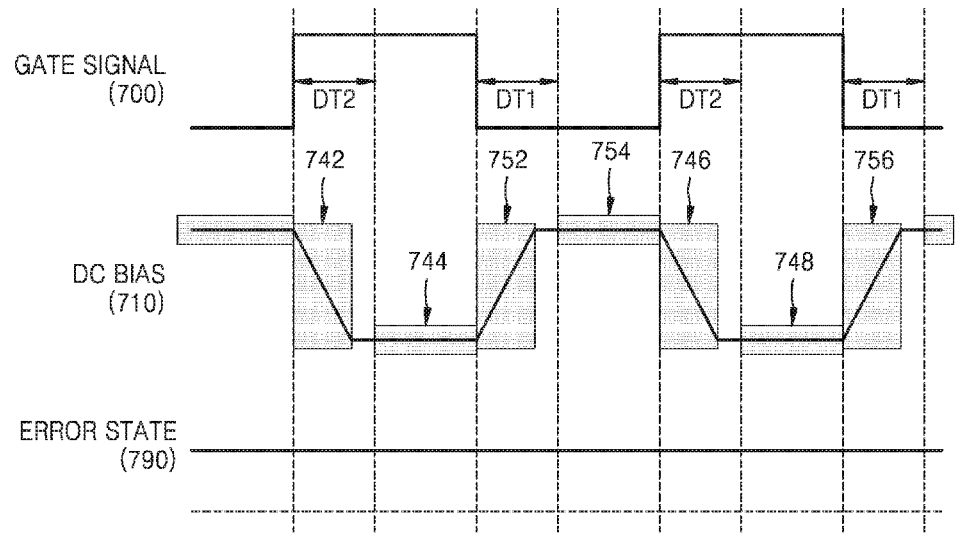
FIG. 7 is a timing diagram illustrating a monitoring period, according to an example embodiment, during which a bias circuit is monitored.

FIG. 7 is a timing diagram illustrating a monitoring period, according to an example embodiment, in which a bias circuit is monitored.

According to an example embodiment, whether a bias circuit is in an abnormal state may be determined based on at least two standards. For example, whether a DC bias of the bias circuit exceeds a threshold value or a threshold range, and whether a rising time and a falling time of the bias circuit exceeds a threshold value or a threshold range may be used for determination. For example, whether the DC bias of the bias circuit exceeds a threshold value or a threshold range, and whether trend of change in a rising time and a falling time of the bias circuit exceeds a threshold value or a threshold range may be used for determination. Furthermore, all of these three standards may be used for determination, and more standards may be used for determination.

Referring to FIG. 7, a standard regarding a magnitude of a DC bias 710 of a bias circuit, which corresponds to a gate signal 700, may be used for determination during partial periods 744, 754, and 748 in an RF signal transmission mode and an RF signal reception mode, and standards regarding a rising time and a falling time of the bias circuit may be used for determination during other partial periods 742, 752, 746, and 756 in the RF signal transmission mode and the RF signal reception mode. Partial periods in each of the RF signal transmission mode and the RF signal reception mode, such as partial periods 742 and 744 in the RF signal transmission mode, are illustrated as being discontinuous in FIG. 7, but every partial period in each of the RF signal transmission mode and the RF signal reception mode may be continuous. An error state 790 of the bias circuit may be determined based on a result of monitoring the bias circuit.

According to an example embodiment, the bias circuit may be monitored during a whole period of an RF signal transmission mode and an RF signal reception mode when every partial period in each of the RF signal transmission mode and the RF signal reception mode are continuous.

Therefore, the bias circuit may be monitored thoroughly during a whole period of an RF signal transmission mode and an RF reception mode so a bias circuit may be monitored and an error thereof may be detected in real-time while the bias circuit is being used.

Figure 8A:
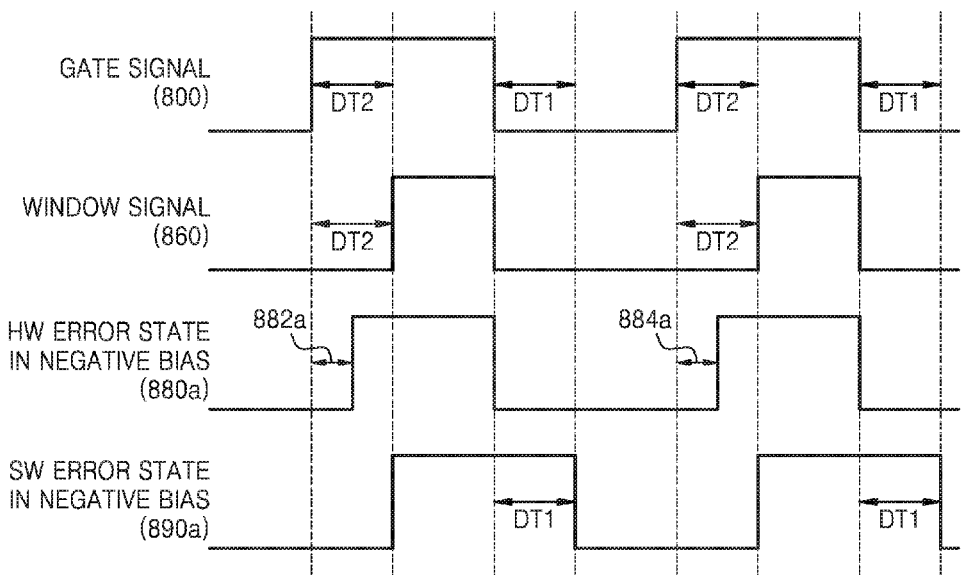
FIGS. 8A, 8B, and 8C are timing diagrams illustrating a hardware error state and a software error state of a bias circuit, according to an example embodiment.
Figure 8B:
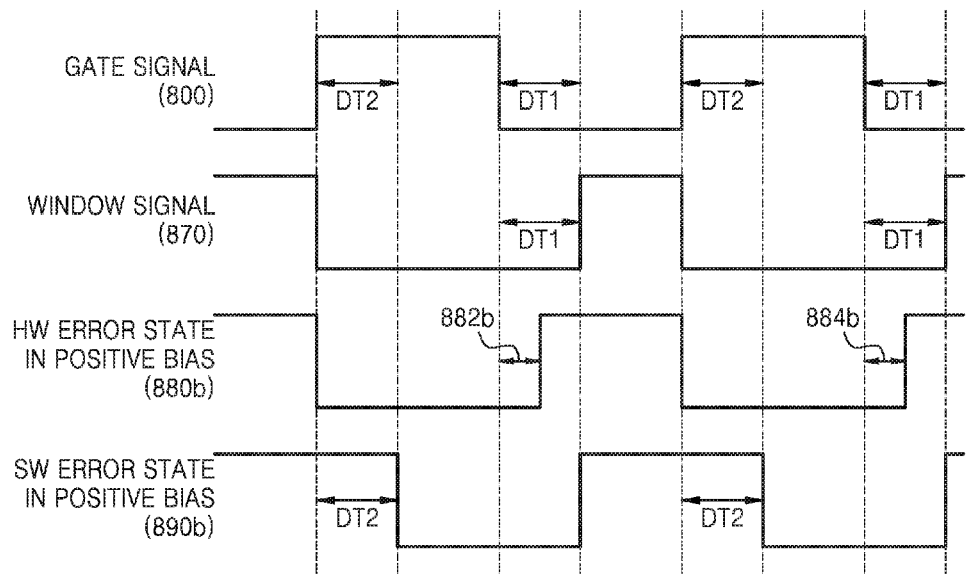
Figure 8C:
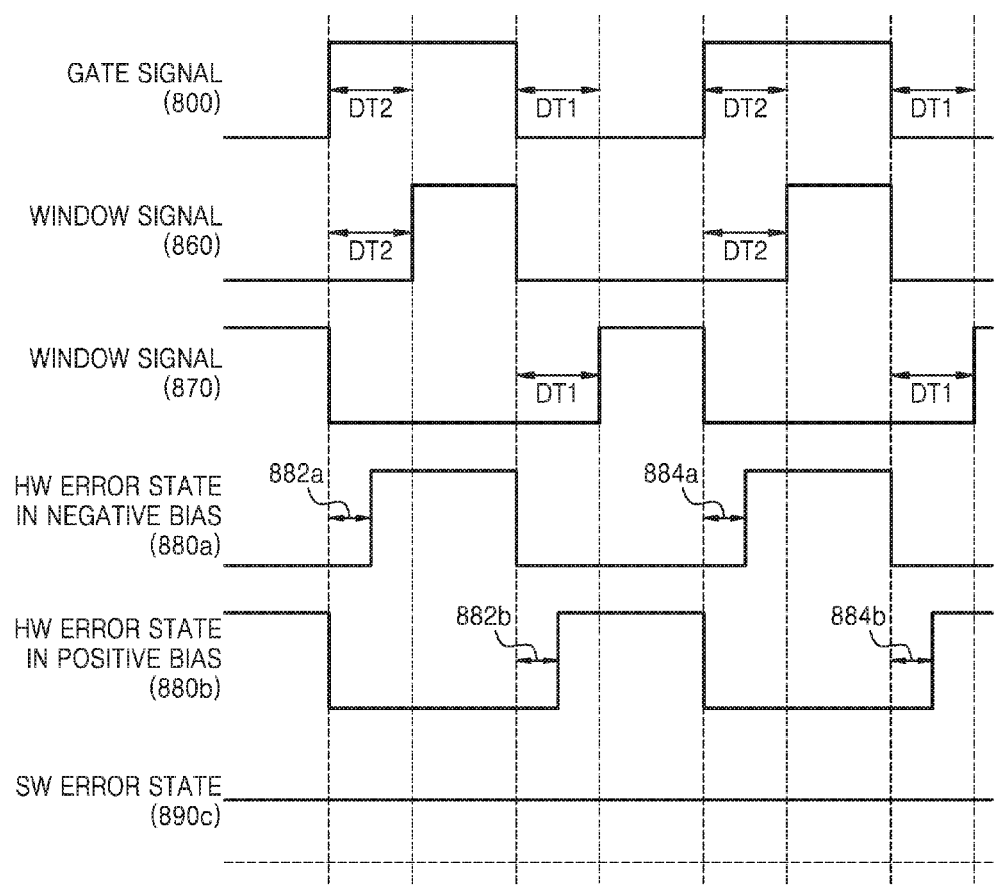

FIGS. 8A, 8B, and 8C are timing diagrams illustrating a hardware error state and a software error state of a bias circuit, according to an example embodiment.

FIG. 8A illustrates a timing diagram explaining a hardware error state 880*a* and a software error state 890*a* of the bias circuit in a negative bias, FIG. 8B illustrates a timing diagram illustrating a hardware error state 880*b* and a software error state 890*b* of the bias circuit in a positive bias.

According to an example embodiment, whether a bias circuit is in a hardware abnormal state and whether the bias circuit is in a software abnormal state may be determined.

According to one example embodiment, a hardware error state of a bias circuit may be determined based on a status of a gate signal 800 and a bias of the bias circuit. For example, it may be determined that the bias circuit in reverse-bias is in a normal state when the gate signal 800 transits to high. Referring to FIG. 8A, the gate signal 800 has transited to high, but reverse-bias of the bias circuit is delayed due to a falling time 882*a* or 884*a*. Therefore, the hardware error state 880*a* is low during the falling time 882*a* or 884*a*.

According to one example embodiment, the software error state 890*a* of a bias circuit may be determined based on a window signal 860 and the hardware error state 880*a*. For example, when both of the hardware error state 880*a* and the window signal 860 are high, the software error state 890*a* may be also high, which means that the bias circuit is in a normal state. The software error state 890*a* may remain high for a time even after the gate signal 800 transits to low. The time may be a first delay time DT1 as illustrated in FIG. 8A. That is, the software error state 890*a* during an RF signal reception mode may be extended by the first delay time DT1. Likewise, the software error state 890*a* during an RF signal transmission mode may be extended by a second delay time DT2.

Referring to FIG. 8B, it may be determined that the bias circuit in forward-bias is in a normal state when the gate signal 800 transits to low. An explanation with regard to FIG. 8A may be applied to FIG. 8B, thus redundant explanation is omitted.

FIG. 8C illustrates a timing diagram in which the hardware error states 880*a* and 880*b* and the software error states 890*a* and 890*b* of FIGS. 8A and 8B are shown together. A software error state 890*c* may be shown as illustrated in FIG. 8C by combining the software error state 890*a* in negative bias of FIG. 8A and the software error state 890*b* in positive bias of FIG. 8B are combined together. The software error state 890*c* may be high during a whole period of an RF signal transmission mode and an RF signal reception mode. That is, it may be determined that a bias circuit is in a normal state for the whole period.

Figure 9A:
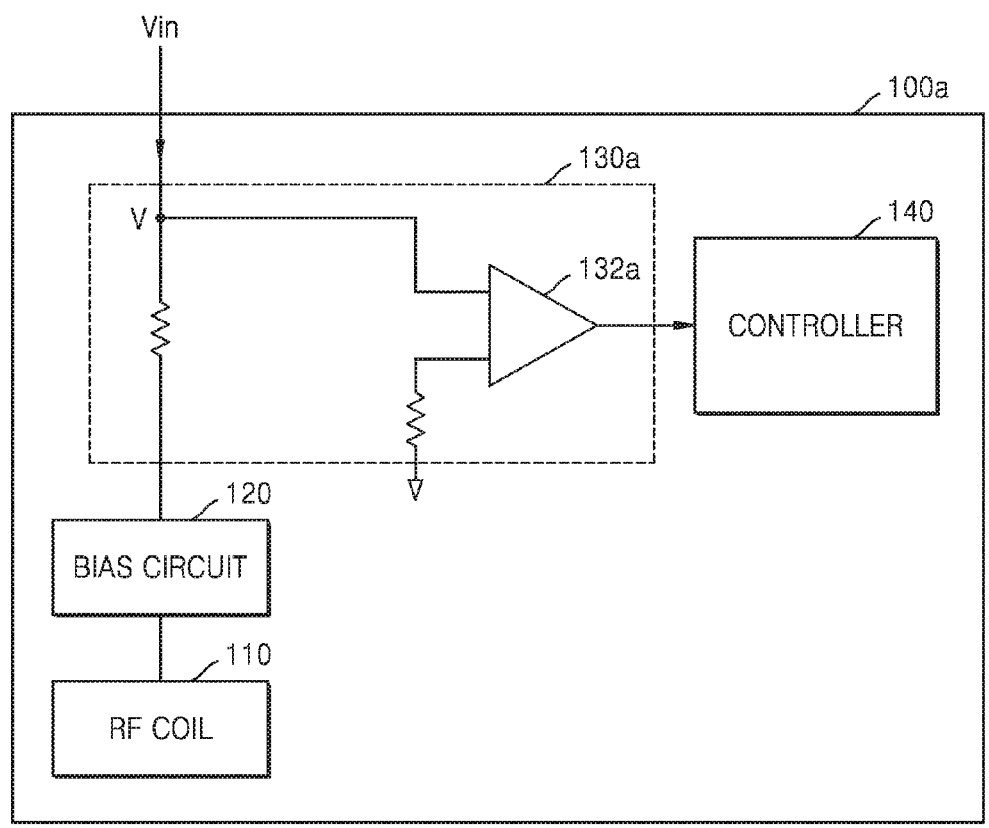
FIGS. 9A, 9B, and 9C are schematic circuit diagrams of an MRI apparatus according to an example embodiment.
Figure 9B:
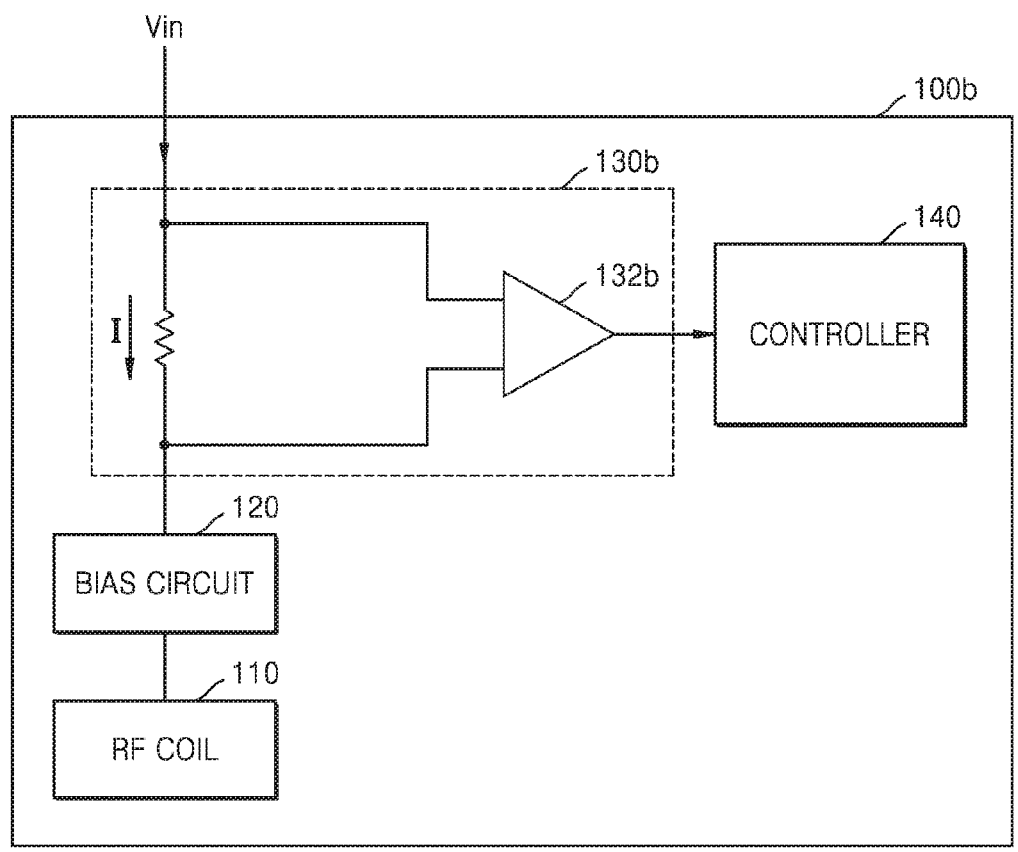
Figure 9C:
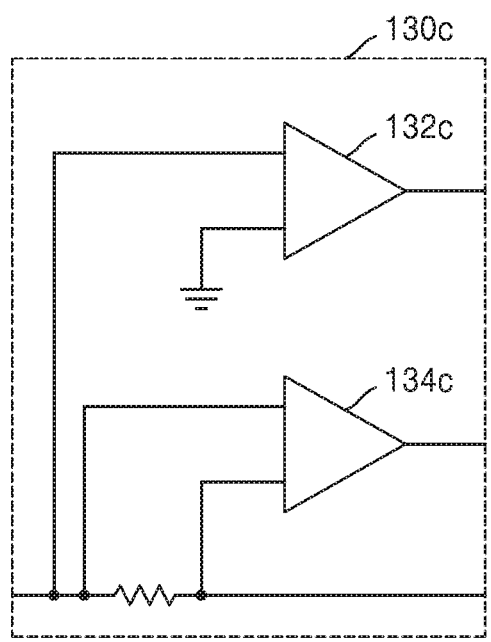

FIGS. 9A, 9B, and 9C are schematic circuit diagrams of an MRI apparatus according to an example embodiment.

Referring to FIG. 9A, a monitoring circuit 130*a* of an MRI apparatus 100*a* may monitor a bias voltage V of a bias circuit 120. Referring to FIG. 9B, a monitoring circuit 130*b* of an MRI apparatus 100*b* may monitor a bias current I of a bias circuit 120.

The monitoring circuit 130*a* of the MRI apparatus 100*a* may differ from the monitoring circuit 130*b* of the MRI apparatus 100*b*. An RF coil 110, the bias circuit 120, and a controller 140 of the MRI apparatus 100*a* may be the same with ones of the MRI apparatus 100*b*.

Referring to FIG. 9A, the monitoring circuit 130*a* of the MRI apparatus 100*a* may include at least one active element 132*a* to monitor a bias voltage V of the bias circuit 120. For example, the active element 132*a* may be a voltage comparator. Whether a bias voltage V is greater than or less than a threshold voltage may be determined based on a voltage output by the voltage comparator. Whether a bias voltage V is within a threshold voltage range may be determined based on a voltage output by the voltage comparator. An analog signal output by the voltage comparator may be converted to a digital signal to be transmitted to the controller 140.

A short circuit in which a bias voltage V of the bias circuit 120 equals or is close to 0 may be detected by monitoring the bias voltage V. If an element of the bias circuit 120 is in an abnormal state, the bias circuit 120 may short-circuit. Therefore, whether the bias circuit 120 is in the abnormal state may be determined by detecting the short circuit of the bias circuit 120.

If the bias circuit 120 short-circuit, an image quality of an MR image may degenerate. According to an example embodiment, whether the bias circuit 120 is in the abnormal state may be determined conveniently by detecting the short circuit of the bias circuit 120. Thus, degeneration of the image quality of the MR image may be suppressed.

Referring to FIG. 9B, the monitoring circuit 130b of the MRI apparatus 100b may include at least one active element 132b to monitor a bias current I of the bias circuit 120. For example, the active element 132b may be a difference amplifier. A difference between an inverted input and a non-inverted input is amplified by the difference amplifier to be transmitted to the controller 140. The bias current I may be monitored based on the difference amplified by the difference amplifier and a resistance between the inverted input and the non-inverted input. Thus, whether the bias current I is greater than or less than a threshold current, and/or whether the bias current I is within a threshold current range may be determined. An analog signal output by the voltage comparator may be converted to a digital signal to be transmitted to the controller 140.

An open circuit in which a bias current I of the bias circuit 120 equals or is close to 0 may be detected by monitoring the bias current I. If an element of the bias circuit 120 is in an abnormal state, the bias circuit 120 may open-circuit. The bias circuit 120 may open-circuit by series chokes. Therefore, whether the bias circuit 120 is in the abnormal state may be determined by detecting the open circuit of the bias circuit 120.

If the bias circuit 120 open-circuit, a user or a patient using the MRI apparatus 100b may be harmed. According to an example embodiment, whether the bias circuit 120 is in the abnormal state may be determined conveniently by detecting the open circuit of the bias circuit 120. Thus, safety of the user or patient using the MRI apparatus 100b may be secured.

Referring to FIG. 9C, a monitoring circuit 130c that is a combination of the monitoring circuits illustrated in FIGS. 9A and 9B, namely, monitoring circuits 132c and 134c, may simultaneously monitor a bias voltage V and a bias current I of a bias circuit. According to one example embodiment, an abnormal state of an MRI apparatus may be detected more effectively. According to one example embodiment, a short circuit and an open circuit of the bias circuit may be detected together, thus, an image degradation of an MR image may be suppressed and safety of a user or a patient may be secured.

FIG. 10 is a flowchart of a method of detecting an error of an MRI apparatus, according to an example embodiment.

Methods or corresponding operations described with FIGS. 4A, 4B, 4C, 5A, 5B, 6, 7, 8A, 8B, 8C, 9A, 9B, and 9C, or a combination thereof may be applied to a method of FIG. 10.

In operation S1000, an MRI apparatus monitors a bias circuit during a first monitoring period in an RF signal transmission mode.

A monitoring circuit of the MRI apparatus may monitor a bias voltage, and/or a bias current of the bias circuit.

In an example embodiment, a first monitoring period may start after a bias of a bias circuit is switched. The bias circuit may be switched off in an RF signal transmission mode, and the first monitoring period may start after the bias circuit is switched off.

In an example embodiment, a bias circuit of an MRI apparatus may be in a steady state during a first monitoring period.

In an example embodiment, a first monitoring period may be shorter than a duration of an RF signal transmission mode. The first monitoring period may start after a first delay time after the RF signal transmission mode starts, the first delay time may be a transmission delay time.

In an example embodiment, a duration of the RF signal transmission mode may be a sum of a first monitoring period and a first delay time.

In operation S1010, an MRI apparatus monitors a bias circuit during a second monitoring period in an RF signal reception mode.

In an example embodiment, a second monitoring period may start after a bias of a bias circuit is switched. The bias circuit may be switched on in an RF signal reception mode, and the second monitoring period may start after the bias circuit is switched on.

In an example embodiment, a bias circuit of an MRI apparatus may be in a steady state during a second monitoring period.

In an example embodiment, a second monitoring period may be shorter than a duration of an RF signal reception mode. The second monitoring period may start after a second delay time after the RF signal reception mode starts, the second delay time may be a reception delay time.

In an example embodiment, a duration of an RF signal reception mode may be a sum of a second monitoring period and a second delay time.

A first delay time may be longer than a second delay time.

In an example embodiment, a first monitoring period and a second monitoring period may continue while a bias of a bias circuit is being switched. Here, the bias circuit may be in a transient state. In an example embodiment, the first monitoring period and the second monitoring period may coincide with the time used for the bias of the bias circuit to be switched. The first monitoring period and the second monitoring period may start before the bias of the bias circuit starts switching, and may continue after the bias finishes switching.

In an example embodiment, while a bias of a bias circuit is switched, whether the bias circuit is in an abnormal state may be determined by comparing a rising time of either one or both of a bias voltage and a bias current with a threshold value.

In an example embodiment, a falling time of the either one or both of the bias voltage and the bias current may be compared with a threshold value. Furthermore, both of the falling time and the rising time may be compared with threshold values.

In operation S1020, the MRI apparatus determines whether the bias circuit is in an abnormal state, based on a monitoring result of operations S1000 and S1010.

In an example embodiment, whether a bias circuit is in an abnormal state may be determined based on comparing the monitored bias voltage and/or bias current with threshold values.

In an example embodiment, whether a bias circuit is in an abnormal state may be determined based on comparing the monitored rising time and/or falling time with threshold values.

In an example embodiment, whether a bias circuit is in an abnormal state may be determined based on trend of change in the monitored rising time and falling time.

For example, when the monitored rising time shortens gradually, the MRI apparatus may determine that the bias circuit is in the abnormal state.

In an example embodiment, when it is determined that a bias circuit is not in an abnormal state, an MRI apparatus may prepare to scan a patient. When it is determined that a bias circuit is in an abnormal state, an MRI apparatus may display a message that it is impossible to scan a patient. A monitoring result of a monitoring circuit may be displayed together with the message that it is impossible to scan a patient.

According to one example embodiment, a user and a patient uses an MRI apparatus of a normal state, thus, safety of the user and patient may be secured. The user may take an appropriate action based on the monitoring result of the monitoring circuit.

In an example embodiment, an MRI apparatus may monitors a bias circuit and determine whether the bias circuit is in an abnormal state during a scan. When it is determined that the bias circuit is not in an abnormal state during the scan, the MRI apparatus may continue scanning a patient. When it is determined that the bias circuit is in an abnormal state during the scan, the MRI apparatus may stop scanning a patient. The MRI apparatus may display a monitoring result of a monitoring circuit with a scanning-stop message.

According to one example embodiment, a user may check an MRI apparatus during a scan, and thus, safety of the user or patient may be improved. An accident may be prevented because the MRI apparatus stops scanning if it determines that its bias circuit is in an abnormal state.

In an example embodiment, when an MRI apparatus monitors a bias circuit during a scan, a rising time and a falling time of a bias voltage and/or a bias current may be recorded. A log of the rising time and the falling time may be accumulated. The MRI apparatus may refer to a record or log of the rising time and the falling time, and determines whether the bias circuit is in an abnormal state based on trend of change in the rising time and the falling time.

According to one example embodiment, durability of the bias circuit of the MRI apparatus may be estimated by checking the rising time and the falling time of the bias voltage and/or bias current. Therefore, safety of a user and a patient using the MRI apparatus may be improved.

FIG. 11 is a flowchart of a method of detecting an error of an MRI apparatus, according to another example embodiment.

Methods or corresponding operations described with FIGS. 4A, 4B, 4C, 5A, 5B, 6, 7, 8A, 8B, 8C, 9A, 9B, 9C, and 10 or a combination thereof may be applied to a method of FIG. 11.

In operation S1100, an MRI apparatus monitors a bias circuit.

The operation S1100 may be substantially identical to the operation S1000.

In operation S1110, the MRI apparatus determines an output state of the bias circuit.

The output state of the bias circuit may be a steady state or a transient state. When the output state of the bias circuit is the steady state, the bias circuit may maintain its output. When the output state of the bias circuit is the transient state, an output of the bias circuit may vary.

In operation S1120, the MRI apparatus determines whether the bias circuit is in an abnormal state based on a first standard, when the output state of the bias circuit is a steady state.

In an example embodiment, the first standard may be comparing a bias voltage and/or a bias current of the bias circuit with first threshold values. The first threshold values may be a voltage value, a current value, a voltage range, or a current range.

In operation S1130, the MRI apparatus determines whether the bias circuit is in an abnormal state based on a second standard, when the output state of the bias circuit is a transient state.

In an example embodiment, the second standard may be comparing a rising time and a falling time of a bias voltage and/or a bias current of the bias circuit with second threshold values. The second threshold values may be a rising time, a falling time, a rising time range, or a falling time range.

In an example embodiment, the second standard may be trend of change in a rising time and a falling time of a bias voltage and/or a bias current of the bias circuit. For example, it may be determined that the bias circuit is in the abnormal state when the rising time shortens gradually.

The example embodiments can be written as computer programs and can be implemented in general-use digital computers that execute the programs using a computer-readable recording medium.

Examples of the computer-readable recording medium include magnetic storage media (e.g., ROM, floppy disks, hard disks, etc.), optical recording media (e.g., CD-ROMs or DVDs), etc.

While the present disclosure has been shown and described with reference to the example embodiments thereof, it will be understood by those of ordinary skill in the art that various changes in form, and details may be made therein without departing from the spirit and scope as defined by the following claims. That is, the example embodiments are examples and may be understood as not limiting the scope defined by the claims.

What is claimed is:

1. A magnetic resonance imaging apparatus comprising:
    a radio frequency (RF) coil configured to transmit and receive an RF signal;
    a bias circuit configured to tune and detune the RF coil;
    a monitoring circuit configured to monitor a parameter among a bias voltage and a bias current of the bias circuit; and
    a controller configured to:
        determine, when the monitored parameter among the bias voltage and the bias current is in a steady state, whether the bias circuit is in an abnormal state, based on a first determination criteria and the monitored parameter; and
        determine, when the monitored parameter among the bias voltage and the bias current is in a transient state, whether the bias circuit is in the abnormal state, based on a second determination criteria and the monitored parameter.

2. The apparatus of claim 1, wherein the first determination criteria is based on comparing the monitored parameter among the bias voltage and the bias current with threshold values.

3. The apparatus of claim 1, wherein the second determination criteria is based on a rising time period and a falling time period of the monitored parameter among the bias voltage and the bias current.

4. The apparatus of claim 3, wherein the second determination criteria is based on a trend of a change in the rising time period and the falling time period.

5. The apparatus of claim 1, wherein the bias circuit is further configured to detune the RF coil in a RF signal transmission mode, and tune the RF coil in a RF signal reception mode, and
the monitoring circuit is further configured to monitor the parameter among the bias voltage and the bias current, during a first monitoring time period in the RF signal transmission mode, during a second monitoring time period in the RF signal reception mode, and during a third monitoring time period while the bias circuit is being switched between the RF signal transmission mode and the RF signal reception mode, the first monitoring time period and the second monitoring time period being respectively shorter than a duration of the RF signal transmission mode and a duration of the RF signal reception mode.

6. The apparatus of claim 5, wherein the bias circuit is in the steady state during the first monitoring time period and during the second monitoring time period, and is in the transient state during the third monitoring time period.

7. The apparatus of claim 1, wherein the bias circuit comprises a positive-intrinsic-negative diode.

8. A magnetic resonance imaging apparatus comprising:
a radio frequency (RF) coil configured to transmit and receive an RF signal;
a bias circuit configured to detune the RF coil in a RF signal transmission mode, and tune the RF coil in a RF signal reception mode;
a monitoring circuit configured to:
monitor, in the RF signal transmission mode, a parameter among a bias voltage and a bias current during a first monitoring time period that is shorter than a duration of the RF signal transmission mode; and
monitor, in the RF signal reception mode, the parameter among the bias voltage and the bias current during a second monitoring time period that is shorter than a duration of the RF signal reception mode; and
a controller configured to determine whether the bias circuit is in an abnormal state, based on the monitored parameter among the bias voltage and the bias current.

9. The apparatus of claim 8, wherein the first monitoring time period starts after a first delay time period after the RF signal transmission mode starts, and
the second monitoring time period starts after a second delay time period after the RF signal reception mode starts.

10. The apparatus of claim 9, wherein the first delay time period is longer than the second delay time period.

11. The apparatus of claim 8, wherein the first monitoring time period starts after the bias circuit is switched off, and
the second monitoring time period starts after the bias circuit is switched on.

12. The apparatus of claim 8, wherein the bias circuit is in a steady state or a transient state during the first monitoring time period and the second monitoring time period, and
the controller is further configured to determine whether the bias circuit is in the abnormal state by comparing the monitored parameter among the bias voltage and the bias current of the bias circuit in the steady state, with first threshold values.

13. The apparatus of claim 12, wherein, when the bias circuit is in the transient state during the first monitoring time period and the second monitoring time period, the controller is further configured to determine whether the bias circuit is in the abnormal state by comparing a rising time period and a falling time period of the monitored parameter with second threshold values, in response to the bias circuit being in the transient state.

14. A method of detecting an error of a magnetic resonance imaging apparatus comprising a radio frequency (RF) coil transmitting and receiving an RF signal, and a bias circuit tuning and detuning the RF coil, the method comprising:
monitoring a parameter among a bias voltage and a bias current of the bias circuit; and
determining, when the monitored parameter among the bias voltage and the bias current in a steady state, whether the bias circuit is in an abnormal state, based on a determination criteria and the monitored parameter; and
determining, when the monitored parameter among the bias voltage and the bias current is in a transient state, whether the bias circuit is in the abnormal state, based on a second determination criteria and the monitored parameter.

15. A non-transitory computer-readable storage medium storing a program to cause a computer to perform the method of claim 14.

16. A method of detecting an error of a magnetic resonance imaging apparatus comprising a radio frequency (RF) coil transmitting and receiving an RF signal, and a bias circuit tuning the RF coil in a RF signal transmission mode and detuning the RF coil in a RF signal reception mode, the method comprising:
monitoring, in the RF signal transmission mode, a parameter among a bias voltage and a bias current during a first monitoring time period that is shorter than a duration of the RF signal transmission mode;
monitoring, in the RF signal reception mode, the parameter among the bias voltage and the bias current during a second monitoring time period that is shorter than a duration of the RF signal reception mode; and
determining whether the bias circuit is in an abnormal state, based on the monitored parameter among the bias voltage and the bias current.

17. The method of claim 16, wherein the first monitoring time period starts after a first delay time period after the RF signal transmission mode starts, and
the second monitoring time period starts after a second delay time period after the RF signal reception mode starts.

18. The method of claim 16, wherein the first monitoring time period starts after the bias circuit is switched off, and
the second monitoring time period starts after the bias circuit is switched on.

19. The method of claim 16, wherein the bias circuit is in a steady state during the first monitoring time period and the second monitoring time period, and
the method further comprises determining whether the bias circuit is in the abnormal state by comparing the monitored parameter among the bias voltage and the bias current of the bias circuit in the steady state, with first threshold values.

20. A non-transitory computer-readable storage medium storing a program to cause a computer to perform the method of claim 16.

\* \* \* \* \*